United States Patent
Yamauchi

(10) Patent No.: US 7,492,092 B2
(45) Date of Patent: Feb. 17, 2009

(54) SELF-EMITTING ELEMENT, DISPLAY PANEL, DISPLAY APPARATUS, AND METHOD OF MANUFACTURING SELF-EMITTING ELEMENT

(75) Inventor: Taisuke Yamauchi, Suwa (JP)

(73) Assignee: Seiko Epson Corporation, Tokyo (JP)

( * ) Notice: Subject to any disclaimer, the term of this patent is extended or adjusted under 35 U.S.C. 154(b) by 656 days.

(21) Appl. No.: 10/718,676

(22) Filed: Nov. 24, 2003

(65) Prior Publication Data

US 2004/0160165 A1 Aug. 19, 2004

(30) Foreign Application Priority Data

Dec. 17, 2002 (JP) ............................. 2002-365522
Feb. 26, 2003 (JP) ............................. 2003-049396

(51) Int. Cl.
H01J 1/62 (2006.01)
H01J 63/04 (2006.01)

(52) U.S. Cl. .................. 313/506; 313/498; 313/504
(58) Field of Classification Search ................. 313/498, 313/502, 504, 506, 512; 345/76, 82; 428/917
See application file for complete search history.

(56) References Cited

U.S. PATENT DOCUMENTS

| | | | |
|---|---|---|---|
| 5,707,745 A | 1/1998 | Forrest et al. | |
| 6,046,543 A | 4/2000 | Bulovic et al. | 313/504 |
| 6,091,195 A | 7/2000 | Forrest et al. | 313/504 |
| 6,229,160 B1* | 5/2001 | Krames et al. | 257/94 |
| 6,657,236 B1* | 12/2003 | Thibeault et al. | 257/98 |
| 6,894,432 B2 | 5/2005 | Fujieda et al. | 313/506 |
| 6,906,452 B2* | 6/2005 | Ichikawa | 313/110 |
| 7,030,556 B2* | 4/2006 | Adachi et al. | 313/506 |
| 2002/0085390 A1* | 7/2002 | Kiyomoto et al. | 362/555 |
| 2002/0093283 A1* | 7/2002 | Seo et al. | 313/504 |
| 2003/0016539 A1* | 1/2003 | Minano et al. | 362/347 |
| 2004/0017335 A1* | 1/2004 | Kobayashi et al. | 345/82 |
| 2004/0108980 A1* | 6/2004 | Yonekubo et al. | 345/76 |

(Continued)

FOREIGN PATENT DOCUMENTS

CN 1291068 4/2001

(Continued)

OTHER PUBLICATIONS

Garbuzov et al., High-external-quantum-effciency organic light-emitting devices, Mar. 15, 1997, Optics Letters, vol. 22, No. 6.*

*Primary Examiner*—Joseph L Williams
*Assistant Examiner*—Kevin Quarterman
(74) *Attorney, Agent, or Firm*—Oliff & Berridge, PLC

(57) ABSTRACT

A display panel includes a light-emitting layer, a protective layer, a reflective layer, and a reflective surface. The protective layer is deposited on an emitting side of the light-emitting layer and forms an interface with an external medium. The protective layer has a thickness that allows the light emitted from the light-emitting layer to undergo total reflection at least once at the interface in an area of the light-emitting layer. The reflective layer is deposited on an opposite side of the protective layer with respect to the light-emitting layer. The reflective surface is at a periphery of the light-emitting layer and changes the direction of the light propagating inside the protective layer emitted from the light-emitting layer.

23 Claims, 14 Drawing Sheets

U.S. PATENT DOCUMENTS

2004/0119406 A1* 6/2004 Kobayashi .................. 313/506

FOREIGN PATENT DOCUMENTS

| | | |
|---|---|---|
| CN | 1366354 | 8/2002 |
| JP | A 10-189251 | 7/1998 |
| JP | 2001-507503 | 6/2001 |
| JP | A 2001-332388 | 11/2001 |
| JP | 2002-008850 | 1/2002 |
| JP | 2002-151274 | 5/2002 |
| JP | A 2002-202737 | 7/2002 |
| JP | 2002-260845 | 9/2002 |
| JP | 2003-257659 | 9/2003 |
| JP | 2003-317931 | 11/2003 |
| JP | 2003-347052 | 12/2003 |
| JP | 2004-047298 | 2/2004 |
| JP | 2004-192977 | 7/2004 |
| KR | 2002-0055411 | 8/2002 |
| WO | WO 98/28947 | 7/1998 |

* cited by examiner

SELF-EMITTING ELEMENT, DISPLAY PANEL, DISPLAY APPARATUS, AND METHOD OF MANUFACTURING SELF-EMITTING ELEMENT

CROSS-REFERENCE TO RELATED APPLICATIONS

This application is based upon and claims the benefit of priority from the prior Japanese Patent Applications No. 2002-365522 filed on Dec. 17, 2002 and No. 2003-049396 filed on Feb. 26, 2003; the entire contents of which are incorporated herein by reference.

BACKGROUND OF THE INVENTION

1) Field of the Invention

The present invention relates to a self-emitting element like an organic electro-luminescent element (hereinafter, "organic EL element"), a display panel, a display apparatus, and a method of manufacturing the self-emitting element.

2) Description of the Related Art

In recent years, self-emitting flat panel displays (hereinafter, "FPD") in which display panels including light-emitting elements (e.g., organic EL elements) or plasma display panels (hereinafter, "PDP") are used have been developed. Such display panels include a light-emitting layer disposed between an anode electrode and a cathode electrode. The light-emitting layer emits light when a voltage is applied between the electrodes. The light emitted from the light-emitting layer is recognized as characters or images when viewed through a transparent medium or a transparent panel that has a refractive index more than one.

The light from the light-emitting layer is radiated, or in other words emitted in almost all directions (emitted at all angles). Therefore, light that has an angle of incidence not less than a critical angle with respect to an interface between a transparent medium and an external medium undergo total reflection at the interface and confined in the display panel. For example, it is known that light emitted out of the display panel, which uses the organic EL elements, is only about 20 to 30 percent of total light emitted from the organic EL elements.

One approach to increase the emitted light, i.e., to increase efficiency of the light or increase light extraction efficiency, inclined surface portions may be provided inside the panel. Such inclined surface portions allow light propagating at not smaller than the critical angle to undergo reflection or refraction, and therefore, the light is directed at an angle smaller than the critical angle. Particularly, Japanese Patent Application Laid-open Publication No. 10-189251 discloses a top-emission display panel in which light is emitted from a side of a transparent panel covering a light-emitting layer formed on a base substrate. At a periphery of the light-emitting layer, a wedged reflecting member is disposed, and thereby a reflecting structure is formed. Moreover, Japanese Patent Application Laid-open Publication No. 2001-332388 discloses a bottom-emission display panel in which light is emitted from a side of a base substrate on which a light-emitting layer is formed: In this bottom-emission display panel, a structure in which inclined surface portions are formed on an anode and a cathode which sandwich the light-emitting layer.

However, in such structures in which angle of light emitted from the light-emitting layer is changed by the inclined surface portions and thereby total reflection in the interface is inhibited, the display panel is susceptible to become thick. This may impose restriction on making of a very thin flat panel display. To improve the light extraction efficiency from the display panel, it is necessary to change by the inclined surface portions the angle of light incident on the interface between the transparent panel and the external medium at not less than the critical angle. For this, it is necessary to design a structure such that this light or a major part of this light is incident without fail on the inclined surface. In other words, to reduce light incident on the interface between the light-emitting layer and the transparent panel at the critical angle, it is necessary to form high inclined surface portions. This results in thickening of the transparent panel. Therefore, to improve the light extraction efficiency, a thick transparent panel has to be used. This means that the thickness of the display panel is not reduced. On the other hand, if the transparent panel is made thin, the display panel can be made thin. However, the amount of light incident on the interface at not less than the critical angle increases. This results in deteriorating the light extraction efficiency.

Furthermore, the structure to change the angle of the light does not allow all the light emitted from the light-emitting element to be output from the display panel to the external medium.

In a display panel in which a protective layer is deposited on a display layer that includes the light-emitting element, not all the output light from the light-emitting element is output to the external medium. One of the causes of this is that there is an interface also between the light-emitting element and the protective layer and if the refractive index of the protective layer is lower than the refractive index of the light-emitting element, there is a critical angle when the light is input from the light-emitting element to the protective layer. For example, in a general structure of a display panel in which the organic EL elements are sandwiched between the two electrodes as light-emitting elements, a glass substrate is disposed as a protective layer on the display layer formed on a substrate. The refractive index of glass is 1.5 while the refractive index of the light-emitting particle is 1.7. The light emitted from the light-emitting element and passed through an electrode contains a component that undergoes total reflection at the interface. Therefore, out of the light emitted from the light-emitting element, the light having an angle of incidence on the glass substrate not less than the critical angle is reflected at the boundary of the glass substrate and this light cannot be extracted.

If the refractive index of the transparent panel on the display layer as a protective layer or an output layer is made greater than the refractive index of the light-emitting element, the light that is input from the display layer to the transparent panel does not contain a component of total reflection. Therefore, the light emitted from the light-emitting element can be input to the transparent panel. However, if the refractive index of the transparent panel is increased, the difference between the refractive index of the transparent panel and that of air (i.e., an external medium) becomes greater and the critical angle of the light with respect to an interface between the transparent panel and the external medium becomes smaller. Due to this, even if the transparent panel having a refractive index greater than that of the light-emitting element is used, the amount of light that is extracted in the external medium does not increase. Therefore, the light extraction efficiency cannot be improved.

SUMMARY OF THE INVENTION

It is an object of the present invention to at least solve the problems in the conventional technology. The present invention enables to provide a self-emitting element, a display panel, a display apparatus, which improve light extraction efficiency and thereby more light emitted from the light-emitting element is output to an external medium, and a method of manufacturing the self-emitting element.

The present invention allows light emitted from a light-emitting layer to be incident on an interface at greater than a critical angle, that is, allows the light to undergo total reflection. Whereas, the light that has undergone total reflection is reflected on a reflective layer formed on an opposite side of the interface, and thereby multiple reflection is caused to occur. The light with the multiple reflection is guided to an angle changer disposed at a periphery of the light-emitting layer and the angle (i.e., propagating direction) of light is changed.

A self-emitting element according to the present invention includes a light-emitting layer that is disposed between electrodes and that emits light upon applying a voltage between the electrodes; a protective layer that covers an emitting side of the light-emitting layer, forms an interface between the protective layer and an external medium, and has a thickness that allows the light emitted from the light-emitting layer to undergo total reflection at least once at the interface in an area of the corresponding light-emitting layer; a reflective layer that covers an opposite side of the protective layer with respect to the light-emitting layer; and an angle changer that is disposed at a periphery of the light-emitting layer, and changes a direction of the light propagating in the protective layer so that the light is incident on the interface at less than a critical angle.

In the self-emitting element according to the present invention, a thin protective layer having a thickness that allows the light emitted from the light-emitting layer to undergo total reflection at least once, is employed. This thin protective layer enables to make the overall self-emitting element. Similar is a case in a display panel that is equipped with a plurality of light-emitting layers. Thus, by utilizing the total reflection at the interface actively, it is possible to improve the light extraction efficiency and to make the display panel thin. On the other hand, the light emitted at not less than the critical angle with respect to the interface of the protective layer is subjected to multiple reflection by the interface and the reflective layer on the opposite side of the interface. Due to the multiple reflection, the light reaches the angle changer disposed at a periphery of the light-emitting layer. Here, the angle (direction) of the light is changed and the light is output to the external medium. Since it is advisable to have a thin protective layer, an inclined structure that forms the angle changer can be made thinner than a bank or a protrusion that is mentioned below. With such a structure, the light that has reached at a periphery of the light-emitting layer due to the multiple reflection is extracted with the angle (direction) changed by the angle changer without fail. Therefore, the light extraction efficiency is increased. Moreover, a high inclined surface is not required as the angle changer. This reduces time and labor required for making the inclined structure, thereby enabling to provide the display panel at a low cost.

Thus, it is possible to provide the self-emitting element and the display panel that can satisfy the two contradictory requirements, i.e., the improvement in light extraction efficiency and the reduced thickness of the self-emitting element or the display panel. Particularly, in a self-emitting element or a display panel in which an organic electro-luminescent light-emitting layer is employed, the light extraction efficiency is said to be 20 to 30 percent at the most. Therefore, the present invention is very effective. Thus, a very thin display apparatus that includes the display panel according to the present invention and the drive unit that displays an image by driving the light-emitting layer of the display panel can be provided and it is possible to display a bright image.

One aspect of the angle changer that changes the angle of light propagated by the protective layer and makes it smaller than the critical angle, is a reflective surface that is inclined to have a wide emitting side. Further, the angle changer may also be a refractive surface that is inclined to have a narrow emitting side. In any of the cases, the inclined structure is necessary.

If the inclined surface that encloses the surrounding area of the light-emitting layer is high and has a constant slope, the higher the height of the inclined surface is, the longer the distance between the light-emitting layers is. This results in bigger size of the display panel that displays an image with high resolution. Consequently, a display apparatus in which this display panel is used becomes bigger. In other words, if the inclined surface (the angle changer) is low, the distance between the light-emitting layers is short. This allows to reduce the size of a display panel and a display apparatus that displays an image with high resolution, and to make them compact.

Moreover, in a display panel in which a flat surface area that includes the light-emitting layer and the inclined surface corresponds to one pixel, the inclined surface (the angle changer) is included in an area of the pixel with respect to an area (light-emitting surface of the light-emitting layer) of light emission per pixel. Since the area of the angle changer is reduced by the present invention, the area of the pixel can be reduced without reducing the amount of light emitted from the pixel. This means that brightness of the display panel is improved. Thus, the present invention leads to an advantage of having high brightness by reducing a pixel size and enables to display very bright images or characters.

In the self-emitting element and the display panel, one of the two electrodes that sandwich the light-emitting layer, in other words an electrode that is on the opposite side of the emitting side, can be made to be the reflective layer. By doing so, a special reflective layer is unnecessary, and a thinner self-emitting element and a display panel can be provided.

In the self-emitting element and the display panel according to the present invention, it is advisable to form a bank that projects on the emitting side to separate the light-emitting layers from each other and to make an inner surface of the bank as the angle changer. The self-emitting element and the display panel according to the present invention may be constructed so that a sheet or a panel that includes the angle changer is stuck as the protective layer. However, in this construction, light (cross talk) tends to leak through a gap between the light-emitting layer and the protective layer. Moreover, bubbles enter the gap easily during sticking the protective layer. The bubbles may cause scattering of light thereby hindering the light efficiency. Further, it may be difficult to manufacture it without cross talk or entry of bubbles.

For this reason, the protective layer is formed in a region surrounded with the bank by making the inner surface of the bank that is formed at a periphery of the light-emitting layer as the angle changer. This allows the protective layer to be disposed very close to the light-emitting layer. In other words, it is possible to reduce the distance between the protective layer and the light-emitting layer. As a result, the cross talk is reduced. Moreover, forming the protective layer in the region surrounded with the bank may be achieved by cast coating of material of the protective layer. This cast coating enables to avoid the entry of bubbles during the formation of the protective layer. With this structure, thickness of the protective layer is absorbed in the thickness of the bank. In other words, the thickness of the protective layer does not affect the thickness of the self-emitting element or the display panel, and a thinner self-emitting element and display panel can be provided.

Therefore, it is possible to manufacture the self-emitting element with high light efficiency by a method of manufacturing a self-emitting element, wherein the self-emitting element includes a light-emitting layer that is disposed between electrodes and that emits light upon applying a voltage between the electrodes; a protective layer that covers an emitting side of the light-emitting layer, forms an interface between the protective layer and an external medium, and has a thickness that allows the light emitted from the light-emitting layer to undergo total reflection at least once at the interface in an area of the corresponding light-emitting layer; a reflective layer that covers an opposite side of the protective layer with respect to the light-emitting layer; and an angle changer that is disposed at a periphery of the light-emitting layer, and changes direction of the light propagating in the protective layer so that the light is incident on the interface at less than a critical angle, and the method includes forming a bank, as the angle changer, that projects on the emitting side to separate the light-emitting layer from other light-emitting layer; and forming the protective layer in an area that is enclosed with the bank.

Furthermore, a protrusion made of an insulating material is formed so as to project toward the emitting side from the bank, and an inner surface of the protrusion may be made as the angle changer. The protective layer is formed in a region surrounded with the protrusion. However, compared to the structure in which the inner surface of the bank is made to be the angle changer, there is a possibility of occurrence of cross talk in the bank. Therefore, the structure in which the inner surface of the bank is made to be the angle changer is the most desirable. On the other hand, in the structure in which the inner surface of the bank is made to be the angle changer, when a film like that of aluminum etc. is applied on the inner side of the bank to make the angle changer, the electrodes that are disposed so as to sandwich the light-emitting layer may get short circuited by the angle changer. Therefore, it is necessary to deposit an insulating film to avoid the short circuit. Thus, the structure in which a protrusion is formed on the bank and the inner surface of the protrusion is made to be the angle changer is suitable in view of the ease of manufacturing the display panel.

A self-emitting element in which an insulating protrusion is formed on the bank and this protrusion is made to be the angle changer, can be manufactured by a method that includes forming a protrusion as the angle changer with an insulating material to separate the light-emitting layer from other light-emitting layer so that the protrusion is protruded from a bank that projects on the light-emitting side; and forming the protective layer in an area that is enclosed with the protrusion.

The present invention can be applied to a self-emitting element or a display panel. Thus, the present invention is applicable to a display object or a display panel in which the PDP, a light-emitting diode (hereinafter, "LED"), an inorganic EL element, an organic EL element, or a field emission element is used. Particularly, a display object (or a self-emitting element) or a display panel in which organic EL elements including an organic EL light-emitting layer as the light-emitting layer is used has a very low light extraction efficiency. Therefore, the present invention is very useful.

Moreover, in the present invention, refractive index of a transparent output layer that includes the angle changer, which changes the direction of the light emitted from the light-emitting element into the direction of emission, is the same or greater than the refractive index of the light-emitting element. This is to achieve input of the light in the output layer without any leakage of light. Also, the light incident on the output layer is directed at an angle smaller than the critical angle of the interface between the output layer and the external medium. This is to enable output of the output light efficiently to the external medium even if the output layer has a high refractive index. In other words, the display object (self-emitting element) according to the present invention includes a display layer that includes the light-emitting element and the transparent output layer that includes the angle changer. The angle changer is disposed in the direction of emission of the display layer, and directs the light emitted from the light-emitting element in the direction of emission. The refractive index of the output layer is the same as or greater than the refractive index of the light-emitting element.

By making the refractive index of the output layer same or greater than that of the light-emitting layer, the light directed from the light-emitting element or the display layer to the output layer has no component that undergoes total reflection. All the light emitted from the front or the top of the light-emitting element excluding light emitted from the bottom of the light-emitting element is extracted in the output layer. By providing in the output layer the angle changer that changes the direction of the light by reflection or refraction, the direction of the light having a bigger angle of incidence with respect to the interface between the output layer and the external medium is changed so that the angle of incidence with respect to the interface is smaller. Even if the critical angle in the boundary with the external medium becomes smaller due to increase in the refractive index, it can be input to the external medium by making the angle of incidence smaller than the critical angle. Thus, the light extraction efficiency can be maintained or improved. Therefore, the self-emitting element (the display object) according to the present invention enables to reduce loss when the light is incident on the output layer from the light-emitting element or the display layer. As a result, the efficiency of light emitted from the light-emitting element can be improved.

A micro lens or a micro prism that changes the direction of light by refraction or a micro mirror that changes the optical path by reflecting the light can be employed as the angle changer that changes the optical path of the light in the output layer. The micro lens can also be used as the output layer.

Even if an output layer having a high refractive index is prepared, if an intermediate layer having a refractive index smaller than that of the light-emitting element is disposed between the light-emitting element and the output layer, the light incident on the output layer is reduced by a component that undergoes total reflection at the interface of the intermediate layer. On the other hand, even if an intermediate layer having a refractive index greater than that of the output layer is disposed between the light-emitting element and the output layer, the light emitted from the light-emitting layer is incident on the output layer at less than the critical angle through the intermediate layer. Therefore, there is no loss of light in the intermediate layer. For this reason, it is necessary that the refractive index of the intermediate layer is greater than that of the light-emitting layer. If the light-emitting element is an organic EL that emits light when a voltage is applied, it is necessary to deposit a transparent layer, which is an electrode for applying voltage to the light-emitting element, on the display layer. This transparent electrode layer becomes an intermediate layer between the light-emitting element and the output layer. Therefore, by making the refractive index of this transparent electrode layer greater than that of the light-emitting element, the loss of the output light in the transparent electrode layer can be minimized.

On the other hand, when the difference between the refractive indices of the output layer and the transparent electrode layer is high, there is a reflection of light at an interface of the output layer and the transparent electrode layer due to difference in the refractive index and the efficiency of light is reduced. Moreover, when an external light is incident, due to reflection of the external light at the interface, the contrast is reduced. Therefore, it is desirable to improve the efficiency of light by providing an anti-reflective layer in the interface between the transparent electrode layer and the output layer and also minimize the reflection of the external light.

Light output from the output layer functions effectively when passing through air (refractive index of air is approximately one) and reaching eyes of a user. A transparent sealing layer may be provided in the direction of emission of the output layer across a space from the output layer. In this case, even if the space is filled with an inert gas having a refractive index of approximately one and the sealing layer is formed by a material having a refractive index of approximately 1.5, all the light input from the output layer to an inert gas layer can be input to the sealing layer. Further, since the refractive indices of the inert gas layer and an air layer on the user side are almost the same, all the light input to the sealing layer can be extracted in air.

In the present invention, in addition to adoption of the thin protective layer, the refractive index of the output layer is made same or greater than that of the light-emitting element. By doing so, the light extraction efficiency can be improved further.

Thus, the self-emitting element (display object) according to the present invention can improve further the efficiency of the light emitted from the light-emitting element, thereby enabling to output light having high brightness. Therefore, a display panel in which a plurality of self-emitting elements (display objects) are arranged two dimensionally in a matrix form can provide sharp images having high brightness. Moreover, a display apparatus that includes the display panel according to the present invention and the drive unit that displays images by driving the light-emitting element of the display panel makes it possible to display even brighter image at low electric power.

DETAILED DESCRIPTION

Figure 1:
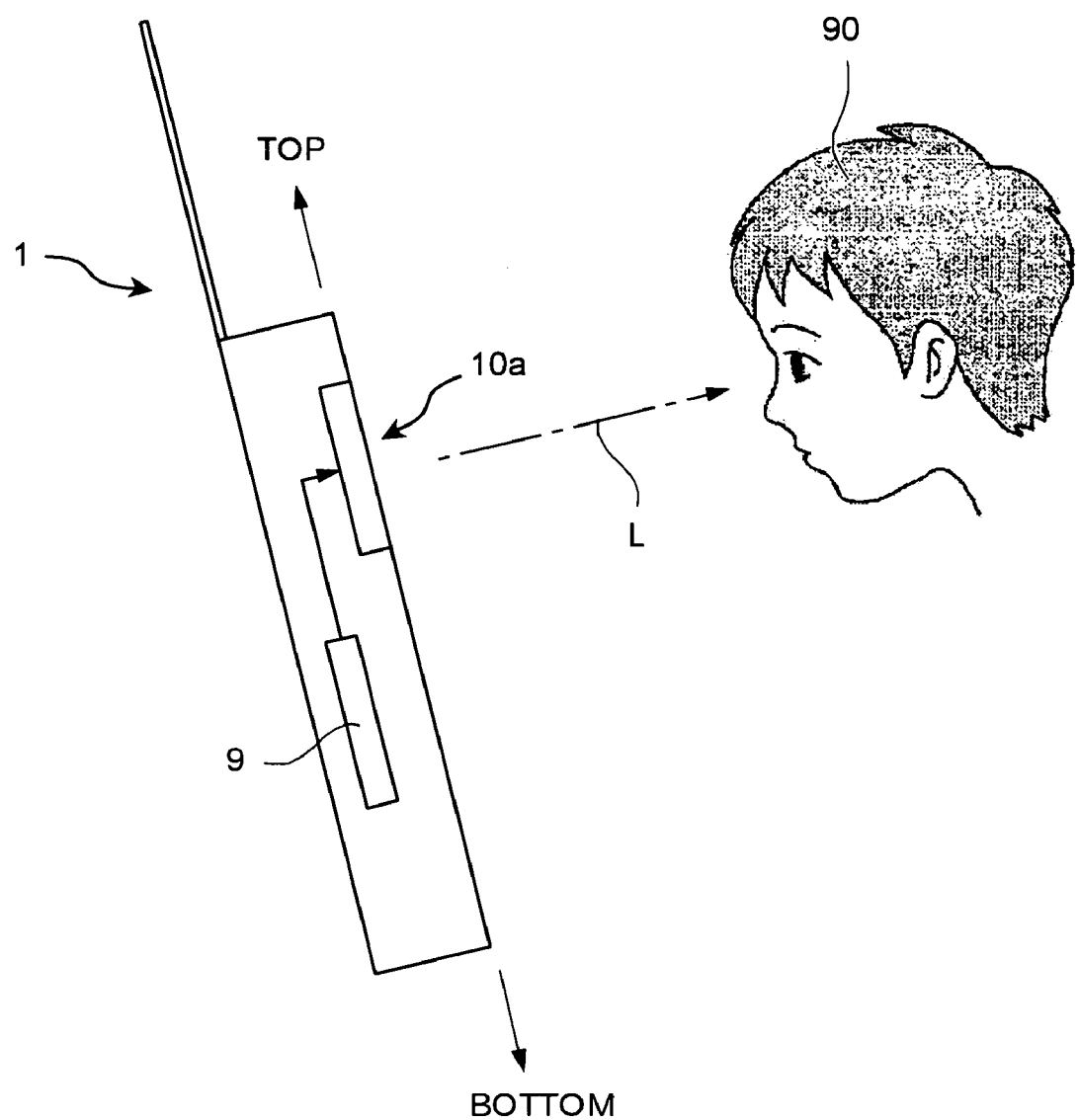
FIG. 1 is a diagram of a display apparatus (a portable telephone) in which a display panel according to the present invention is installed.

The present invention is explained in detail below with reference to the accompanying drawings. FIG. 1 is a diagram of a portable telephone as a display apparatus in which a display panel according to the present invention is installed. A portable telephone 1 in this embodiment includes a display panel 10a on which data is displayed and a drive unit 9. The display panel 10a includes organic EL elements which is self-emitting elements. The drive unit 9 that includes a micro computer causes the organic EL element to emit light L and a user 90 views data that includes characters and images.

Figure 2:
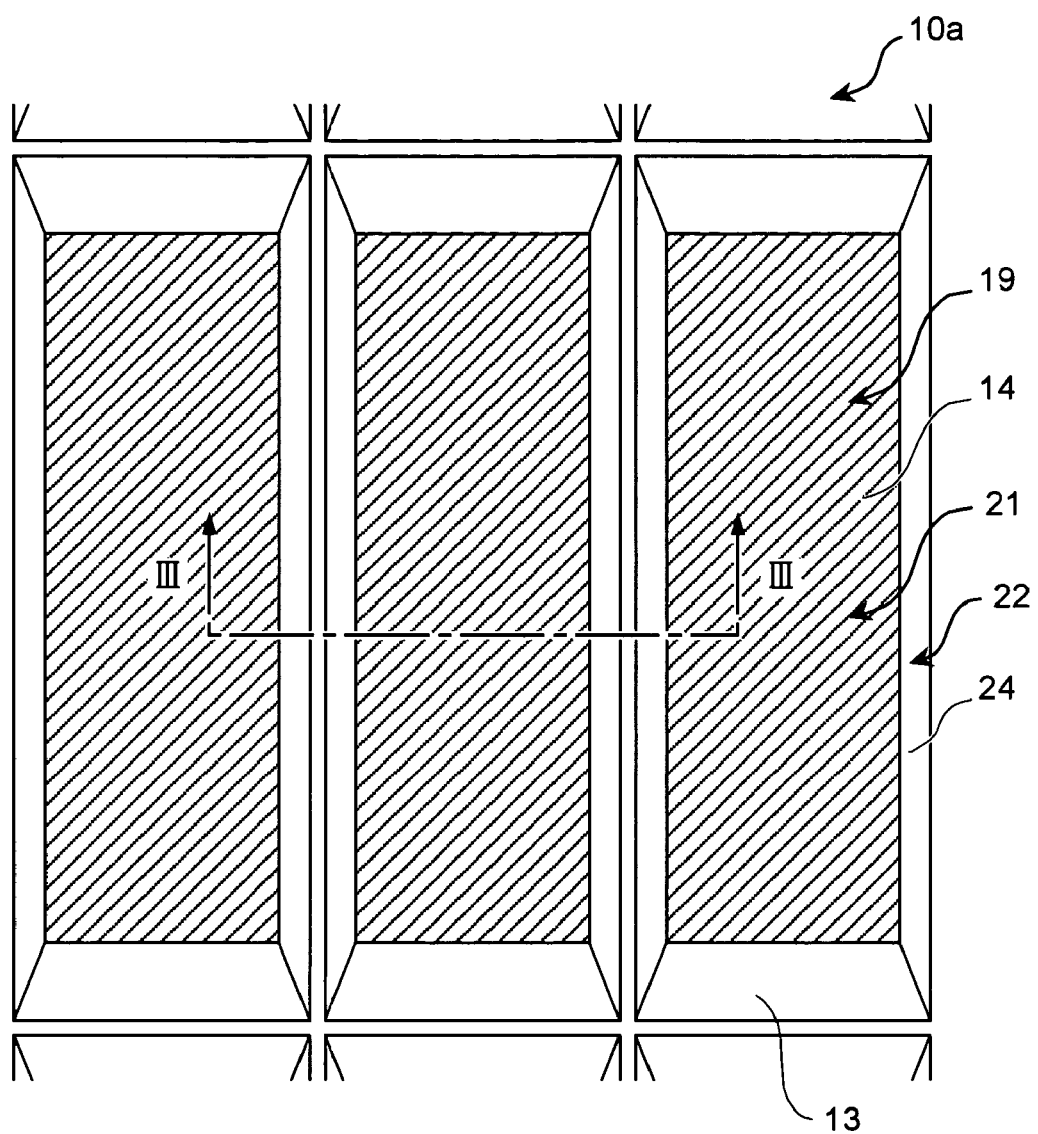
FIG. 2 is a top view of the display panel according to the present invention.
Figure 3:
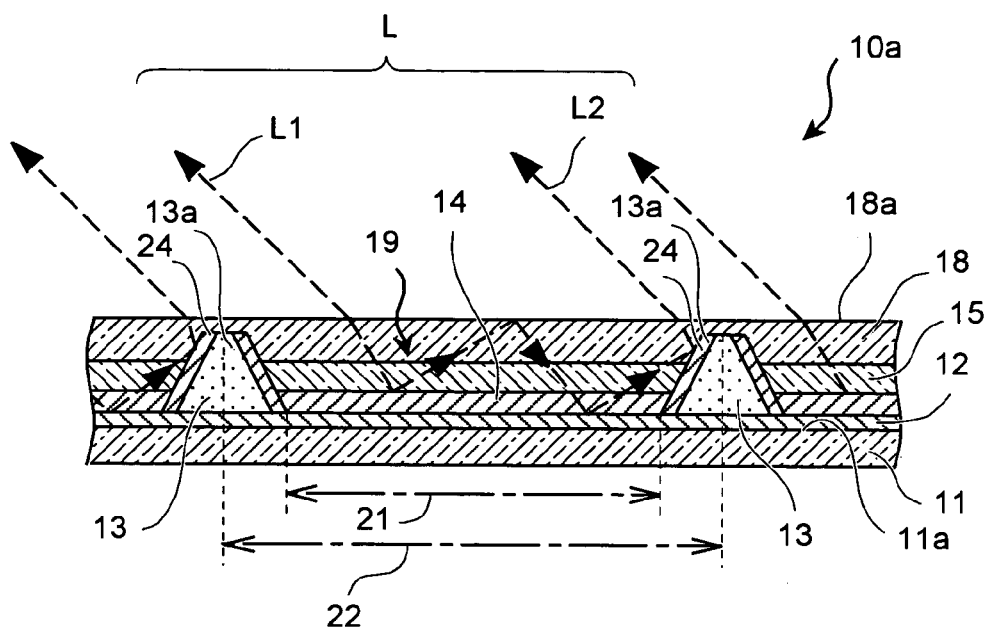
FIG. 3 is a cross sectional view of the display panel in FIG. 2.

FIG. 2 is a top view of the display panel in an enlarged form. FIG. 3 is a cross sectional view of a striped area III. The display panel 10a in this embodiment is formed by disposing a plurality of pixels from the organic EL elements in a matrix form and can be driven by an active matrix or by a passive matrix. The display panel 10a includes a plurality of display objects 19 or a self-emitting element 19 that is disposed in a two dimensional direction in an array form or a matrix form. The display object 19 or a self-emitting element 19 forms one pixel and includes a separate light-emitting layer 14 and a reflective surface 13a at a periphery of the light-emitting layer 14. Therefore, a two dimensional image can be displayed by driving each of the display objects 19. Each of the display objects 19 is disposed between electrodes and includes the light-emitting layer 14 and a protective layer 18. The light-emitting layer 14 emits light when a voltage is applied between the electrodes. The protective layer 18 covers an emitting side of the light-emitting layer 14 and forms an interface 18a with an external medium. The reflective surface 13a that is an angle changer provided at a periphery of the light-emitting layer, changes the direction of light L2 that is propagated in the protective layer 18 to an angle less than a critical angle of the interface 18a of the protective layer. Thus, the efficiency of light and light extraction efficiency are improved by changing the angle.

The display panel 10a further includes a substrate 11 that is a support of a panel like a glass substrate. A cathode layer 12 (also called as an electrode layer 12 or a reflective layer 12) is deposited on an upper surface or a surface 11a of the substrate 11. The cathode layer 12 includes a signal line, a driving element, and a film of multiple layers of a dielectric substance or a metal like aluminum. Thus, in the display panel 10a in this embodiment, the cathode layer 12 is a reflective layer and has a function to reflect a part of light emitted from the light-emitting layer 14 toward the protective layer 18 and to reflect light that undergoes total reflection at the interface 18a toward the protective layer 18. Further, a bank 13 of a predetermined height made of polyimide is deposited in a predetermined pattern on the upper surface 11a of the substrate 11. An area 21 surrounded with banks 13 from four sides is formed. The area 21 is an area of forming the organic EL light-emitting layer 14 and is a light-emitting area. In this embodiment, the light-emitting area 21 that is rectangular in shape having a size of 60 μm×190 μm is formed. An area 22 (hereinafter "pixel area"), which includes inclined side surfaces (inclined surfaces) of the light-emitting area 21 and the bank 13, corresponds to a pixel in the display panel 10a and for example is a pixel area of a size 80 μm×240 μm.

The light-emitting layer 14 is deposited on the area 21 using ink-jet technology. The bank 13 is a layer that can be used for alignment during depositing the light-emitting layer 14 and separates the light-emitting layer 14. The light-emitting layer 14 may be a separate layer that includes an organic EL element or it can be a layer to which a hole transport layer or an electron transport layer is added. A transparent electrode (an anode layer) 15 made of indium tin oxide (hereinafter, "ITO") is formed on the light-emitting layer 14. When a voltage is applied to the cathode layer 12 and the anode layer 15, the light-emitting layer 14 disposed between these electrodes emits light. The protective layer 18 is deposited on the anode layer 15 (light-emitting side) and the emitting side of the light-emitting layer 14 is covered by the protective layer 18. The interface 18a is formed between the protective layer 18 and the external medium. In this case, the electrode layer 12 is a cathode and the electrode layer 15 is an anode. However, if the electrode layer 12 is a reflecting electrode and if the electrode layer 15 is an optically transparent layer, there is no need to restrict to the above mentioned combination.

The protective layer 18 is a thin and transparent layer. The protective layer 18 has a thickness that allows the light emitted from the light-emitting layer 14 at an angle greater than the critical angle with respect to the interface 18a to undergo total reflection at the interface 18a inside the area of the light-emitting layer 14. In a conventional display panel that changes an angle at the inclined surface, a protective layer has a thickness that does not allow the light emitted from the light-emitting layer at an angle such that it undergoes total reflection, to reach an interface between the protective layer and the external medium. Whereas, in the display panel 10a in this embodiment, the protective layer 18, which has a thickness that allows the light emitted at not less than the critical angle to be reflected at the interface 18a, is deposited thinly. Therefore, out of the light L emitted from the light-emitting layer 14, light L1 emitted at an angle smaller than the critical angle with respect to the interface 18a is output from the interface 18a to the external medium. Out of the light L, the light L2 emitted at an angle not smaller than the critical angle with respect to the interface 18a undergoes total reflection and returns toward the light-emitting layer 14 and is reflected once again at the electrode layer 12. The light L2 is propagated inside the protective layer 18. For example, if the protective layer 18 has a refractive index of 1.5, the light L2 incident on the interface 18a at not less than about 42 degrees undergoes total reflection at the interface 18a and is propagated inside the protective layer 18.

The light L2 propagated in the protective layer 18 reaches the inclined surface of the bank 13 at a periphery of the light-emitting area 21. The angle of the light L2 is changed to less than the critical angle. Due to this, the light L2 passes through the interface 18a and is output to the external medium. In other words, a side surface 13a (hereinafter, "reflective surface 13a") of the bank 13 is inclined so that it becomes wider in the direction of the light-emitting side. A reflecting film 24 of aluminum etc. is deposited on the side surface 13a. Due to this, direction (angle) of the light L2 subjected to repetitive reflection between the interface 18a and the reflective layer 12 is changed at the reflective surface 13a. Therefore, the light L2 reflected from the reflective surface 13a is incident on the interface 18a at smaller than the critical angle and is output. For this reason, in the display panel 10a in this embodiment, the light L2 that undergoes total reflection at the interface 18a due to the use of the thin protective layer exists. However, since the light L2 reaches the reflective surface 13a due to multiple reflection and is output to the external medium after having changed the direction, there is hardly any light that is confined due to total reflection. This enables to provide a display panel that has efficiency of light and light extraction efficiency similar to or better than those of the conventional display panel equipped with a thick protective layer and a high reflective surface.

In the conventional display panel, the protective layer is formed so that a ray of light emitted from the light-emitting layer to the interface between the protective layer and the external medium is not reflected totally at the interface. Therefore, it is necessary to make the protective layer thicker. The thickness varies depending on the light-emitting area or the pixel area but the thickness of the protective layer becomes same or greater than the pixel size. For example, if the light-emitting area or the pixel area is 50 μm×50 μm, the required thickness of the protective layer 18 is 70 μm. For the display panel 10a in this embodiment, since it is assumed that the light is reflected totally at the interface 18a of the protective layer 18 and the external medium, the protective layer 18 can be made thinner to the limit of performing the function of protection. Therefore, for the light-emitting area or the pixel area measuring 50 μm×50 μm, it is possible to manufacture a display panel having the very thin protective layer 18 of a few micro meters. This enables to reduce the thickness of the protective layer to one tenth, thereby realizing a very thin display panel.

Figure 4:
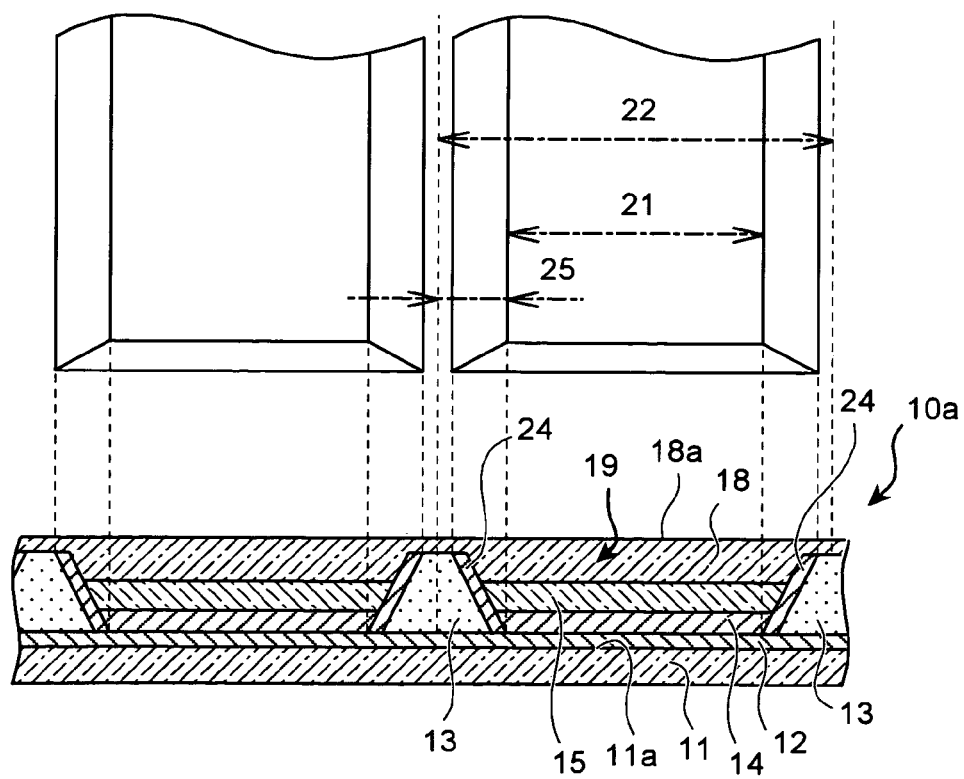
FIG. 4 is a diagram indicating relationship between pixel area and light-emitting area in the display panel in FIG. 2.

Moreover, the reflective surface 13a at a periphery of the light-emitting layer 14 is for changing the direction of light subjected to multiple reflection between the protective layer 18 and the reflective layer 12. The reflective surface 13 does not change the direction of the light such that the light emitted from light-emitting layer 14 by reflecting once is not reflected totally at the interface 18a. Therefore, the height at which the light emitted from the light-emitting layer 14 at an angle such that it undergoes total reflection, is not necessary as in the conventional display panel. This enables to reduce area per pixel. FIG. 4 is an illustration indicating a relationship between the area occupied by the reflective surface 13a and the light-emitting area 21 in the pixel area 22. If the angle of the reflective surface of the display panel 10a is made same as that of the reflective surface of the conventional display panel, the height can be reduced. This enables narrowing of the area that is required to form the reflective surface 13a. Therefore, it is possible to form the light-emitting area 21 that emits same amount of light as in the conventional art with respect to the pixel area 22 and the brightness per pixel increases. Moreover, since the light propagated through the protective layer 18 is output from the surrounding of the pixel, the display object 19 has an amount of light in the surrounding equivalent to the light at the center or more. This enables a display having a high contrast and clear outline.

To put it the other way round, in the conventional art, since the pitch between two pixels is limited, the height of the reflective surface is limited. Therefore, the amount of light output from the interface after having changed the angle by the reflective surface is limited. Whereas, in the present invention, since the protective layer can be made thin and the height of the reflective surface (inclined surface) 24 can also be reduced, it is possible to make an inclined surface of the same height as that of the protective layer 18 or the height greater than that of the protective layer 18. This prevents escaping of light that is propagated in the protective layer 18 and enables to output the light from the interface 18a after having changed its direction. Due to this, it is possible to provide the thin display panel 10a having high light extraction efficiency. However, when the protective layer 18 is made thin, the number of reflections in multiple reflection increases. The reflection at the interface 18a is total reflection and there is not much loss. However, the light is absorbed at metal surfaces like aluminum of the electrode 12 and also during the propagation in the protective layer 18. Thus, the making of the protective layer 18 thin results in loss due to absorption and this may affect the light extraction efficiency.

In any of the cases, in the display panel 10a in this embodiment, it is possible to make the protective layer thin without reducing the light extraction efficiency or with improvement in the light extraction efficiency. This structure enables to achieve two opposite requirements viz. improvement in the light extraction efficiency and making of a thin display panel. Thus, a bright and thin display panel can be manufactured or provided. Further, a low reflective surface can be used and not only the improvement in light extraction efficiency but also the improvement in the brightness per pixel can be easily achieved together. Thus, it is possible to provide a display panel that can display a very bright image. Further, in the display panel 10a, since the electrode 12 disposed on a side opposite to the emitting side of the light-emitting layer 12 is also used as a reflective surface, this is the most suitable arrangement for manufacturing a thin display panel. Moreover, there is no need to consume energy more than that is required. This saves the power consumption of a display apparatus 1 and enables to improve the reliability of the organic EL element.

Figure 5A:
FIG. 5A to FIG. 5D are diagrams indicating process according to a method of manufacturing the display panel in FIG. 2.
Figure 5B:
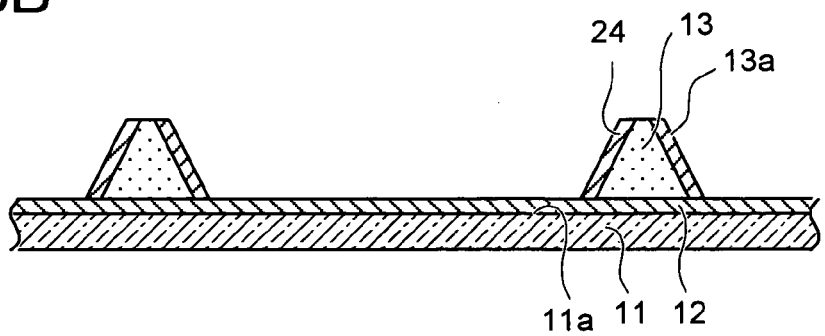

FIG. 5A to FIG. 5D are diagrams indicating process in a method of manufacturing of the display panel 10a. As is shown in FIG. 5A, a substrate 11, like a glass substrate is arranged and the electrode layer (cathode layer) 12 made of aluminum is deposited on the surface 11a. The bank 13 formed with polyimide is formed on the electrode layer 12. The reflecting film 24 which is an aluminum film or a film of multiple layers of a dielectric substance is formed on the side surface (inclined surface) 13a of the bank 13. While forming the conductive reflecting film of aluminum etc., it is necessary to form an insulating film to avoid short circuit between the electrode 12 and the electrode 15.

Figure 5C:
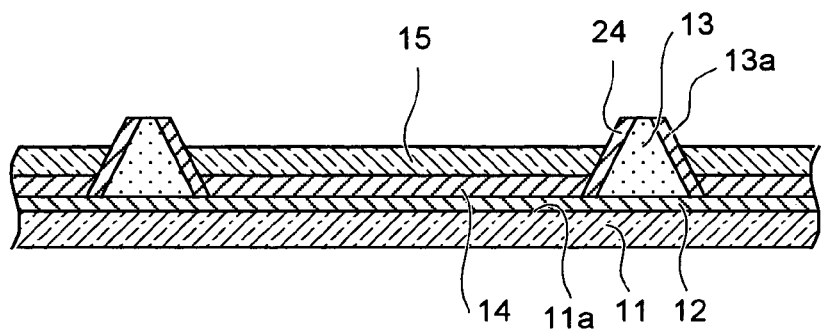
Figure 5D:
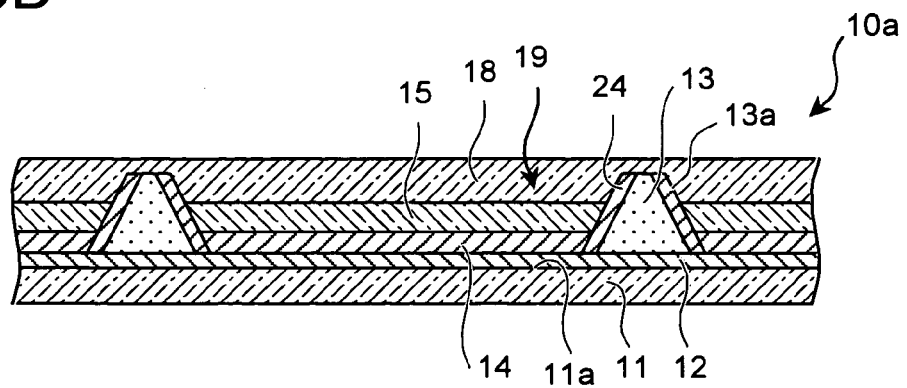

Further, as is shown in FIG. 5C, the light-emitting layer 14 is deposited on area that is surrounded with the bank 13 by impact or by dropping ink solution including an organic EL material by ink-jet method. Further, the electrode layer (anode layer) 15 is deposited on the light-emitting layer. Then, as is shown in FIG. 5D, the thin protective layer 18 is deposited on the emitting side of the substrate 11 formed by the electrode layer 12, the bank 13, the light-emitting layer 14, and the electrode layer 15. Thus, the display panel 10a is manufactured.

Figure 6:
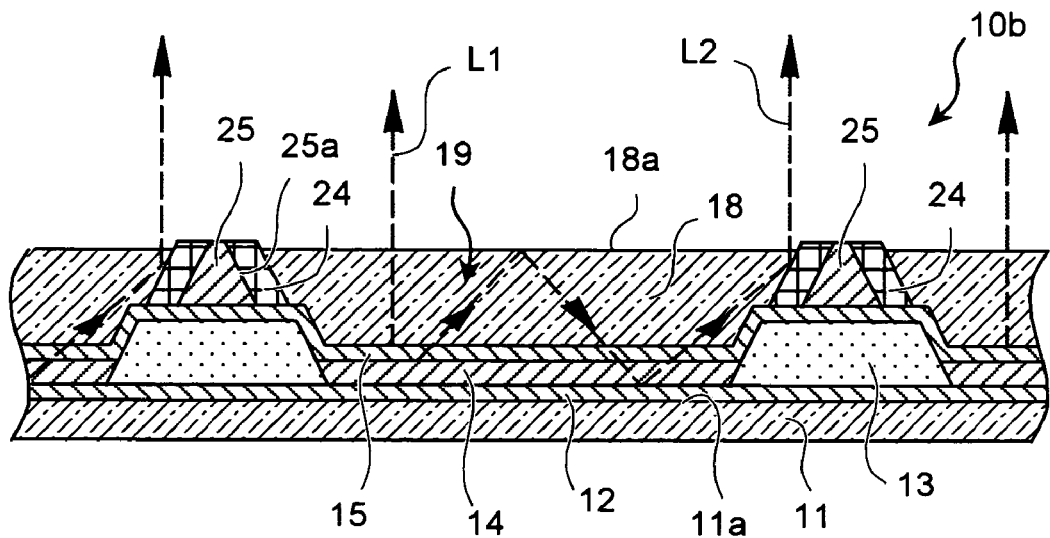
FIG. 6 is a cross sectional view of another display panel.

FIG. 6 is a cross sectional view of another display panel. In the display panel 10a mentioned above, the reflective surface 13a is formed on the bank 13 that surrounds the light-emitting layer 14 and the reflective surface 13a is disposed on side of the light-emitting layer 14. In other words, there is no gap between the reflective surface 13a and the light-emitting layer 14 in a vertical direction or in a direction of emission. Thus, this structure prevents the leakage of light (cross talk) emitted from the light-emitting layer 14 and the maximum efficiency of light is achieved. Further, in this structure, the protective layer 18 is deposited to a small extent on the bank 13 but it is desirable that the protective layer 18 is on the anode layer 15. It is possible to form a structure in which the anode layer 15 is covered by the protective layer 18 having a thickness less than the height of the bank 13. This enables to have a very thin display panel. However, in this display panel 10a, to prevent short circuit between the electrodes, there is a need to form an insulating layer while forming the reflective layer 13a which may complicate the manufacturing of the display panel to a small extent.

Whereas, in a display panel 10b that is shown in FIG. 6, the reflecting film 24 is not formed on the inclined surface 13a of the bank 13 but the anode 15 is formed on the bank 13 and the light-emitting layer 14. Further, the protrusion 25 made of an insulating material is formed on the anode 15 in a position piled up on the bank 13. The reflecting film 24 is formed on an inclined surface 25a of the protrusion 25. The area surrounded with the protrusion 25 is covered by the protective layer 18. With this display panel 10b, there is no concern of short circuit of electrodes by the reflecting film 24 and there is no need to form an insulation film to prevent short circuit between the electrodes. This facilitates manufacturing of the display panel 10b. However, since there is a gap between the light-emitting layer 14 and the reflective surface 25a in the direction of emission, there may be a leakage of light from a part of the bank 13. The height of the protrusion 25 in the display panel 10b can be kept about the same as that of the bank or may be varied. To make the control panel thin, it is desirable that the height of the protrusion 25 is low. On the other hand, when the protective layer 18 is required to be thick enough to perform the function of protection, the thickness of the protective layer 18 can be controlled freely by adjusting the height of the protrusion 25.

Figure 7A:
FIG. 7A to FIG. 7D are diagrams indicating process according to a method of manufacturing the display panel in FIG. 6.
Figure 7B:
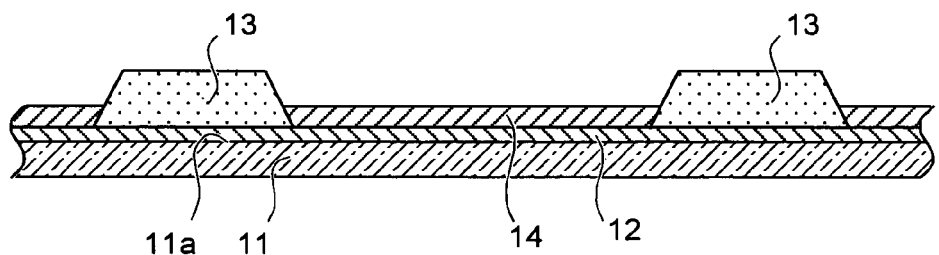
Figure 7C:
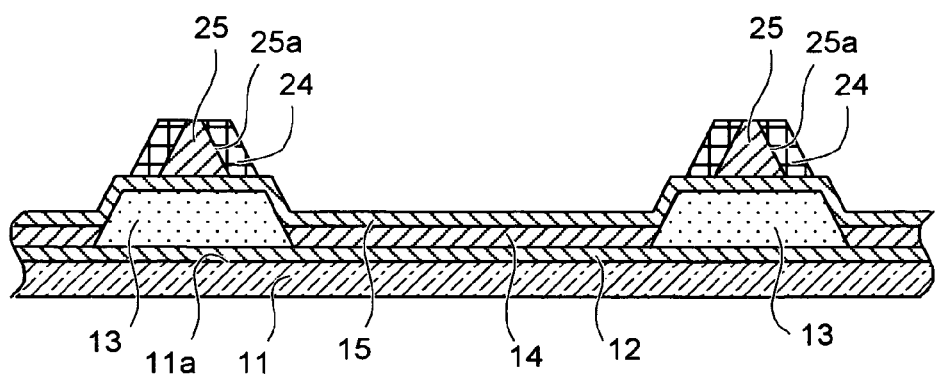
Figure 7D:
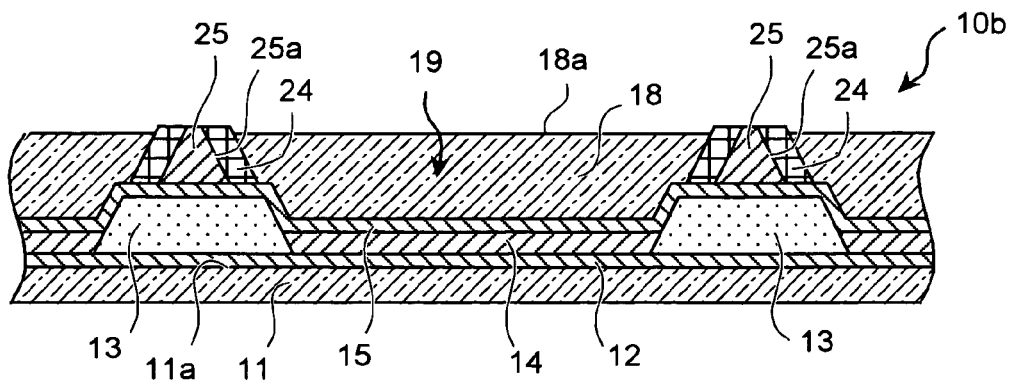

The display panel 10b can be manufactured by the following method. To start with, similarly as in the case of the display panel 10a, the electrode 12, the bank 13, and the light-emitting layer 14 are formed on the surface 11a of the substrate 11 shown in FIG. 7A. As is shown in FIG. 7C, the electrode layer 15 is formed on the light-emitting layer 14 and the bank 13. Further, a protrusion 25 made of an insulating material is formed on the bank 13 (i.e., piling up on the bank 13). The reflecting film 24 is formed on the inclined surface 25a of the protrusion 25. Then, as is shown in FIG. 7D, the protective layer 18 is formed by casting a material that forms the protective layer in the area surrounded with the protrusion 25. Thus, the display panel 10b is manufactured.

Figure 8:
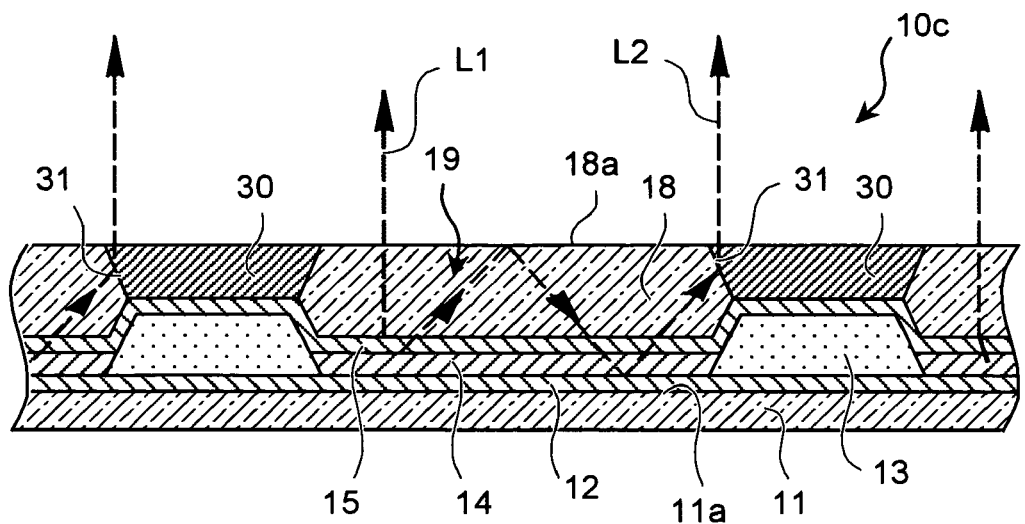
FIG. 8 is a cross sectional view of still another display panel.

FIG. 8 is a cross sectional view of still another display panel 10c. The display panel 10c includes the bank 13, a transparent layer 30, and a refractive surface 31. The transparent layer is piled up on the bank 13 and has a refractive index different than that of the protective layer 18. The refractive surface 31 is formed as the angle changer so that the direction of emission becomes narrow. Thus, the angle changer can also realize the refractive surface apart from the reflective surface.

Figure 9:
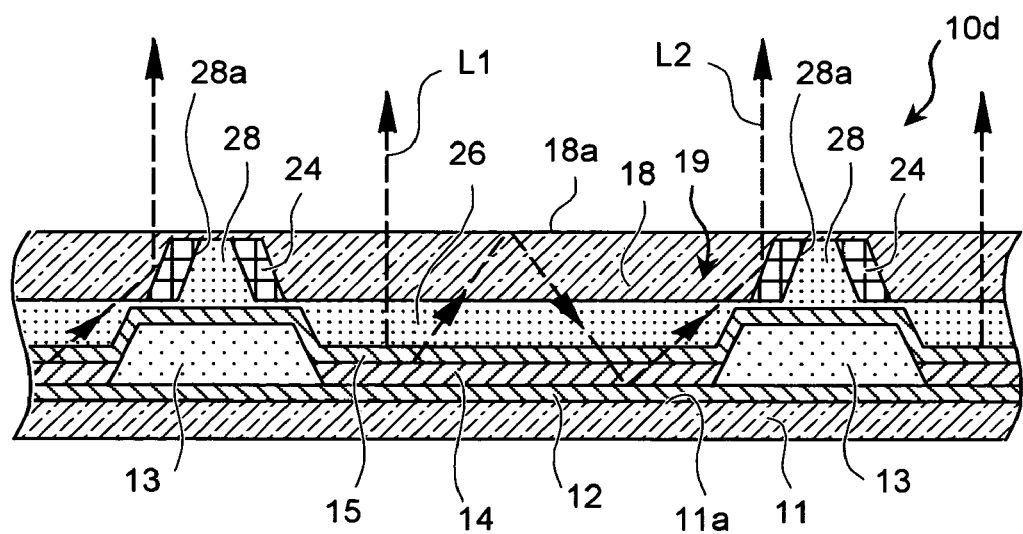
FIG. 9 is a cross sectional view of still another display panel.

FIG. 9 is a cross sectional view of still another display panel 10d. The display panel 10d includes a protective sheet 18 that has a protrusion 28. The reflecting film 24 is formed on a wall surface (inclined surface) of the protrusion 28. The protective sheet 18 is joined to the emitting side of the substrate 11 where the bank 13 is formed, through an adhesive layer 26. In the case of this structure, if the distance between the apex of the mirror 24 and the interface 18a of the protective layer 18 is long, there is a leakage of light from the gap in between. Therefore it is desirable to prevent the leakage of light by shortening these distances (gaps) to the possible extent.

In all the embodiments mentioned above, the reflective surface is inclined such that it is becoming wider toward the light-emitting side. It is also possible to have the reflective surface inclined so that it is becoming narrow toward the light-emitting side. However, if the reflective surface is becoming wider toward the light-emitting side, the number of reflections between the interface 18a and the reflective layer 12 can be decreased. Therefore, considering the absorption loss at the reflective layer 12 or transmittance of the light-emitting layer 14 etc., from point of view of minimizing the decline in the optical power due to the multiple reflection, it is desirable to have the reflective surface that becomes wider in the direction of emission.

Figure 10:
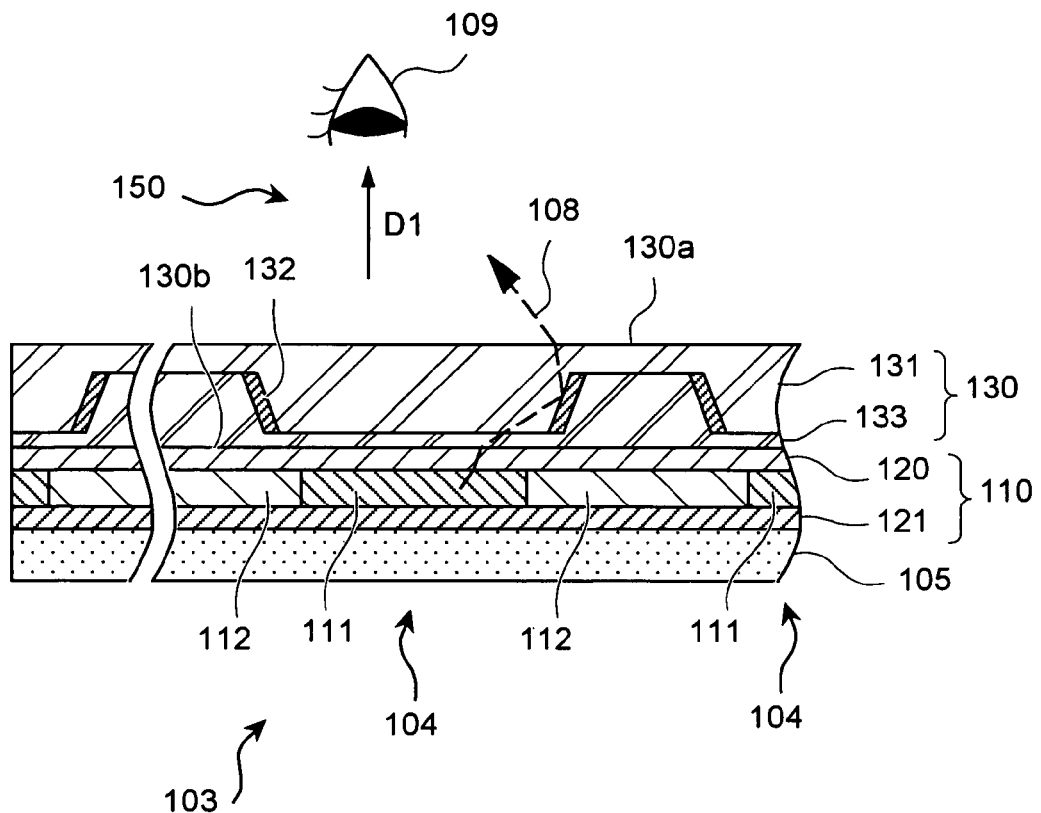
FIG. 10 is a cross sectional view of the display panel according to the present invention.

FIG. 10 is an enlarged view of a part of cross section of a display panel 104 that is a self-emitting element included in another display panel 103. The display panel 103 includes a substrate 105, a display layer, 110, and an output layer 130 that are deposited in order on the substrate 105. The display object 110 is separated by a bank 112 made of polyimide. The organic EL element disposed two dimensionally in a matrix form is taken as a light-emitting element 111 which is a light-emitting layer. This light-emitting element 111 is sandwiched between an electrode 120 and an electrode 121. Out of these two electrodes, the electrode 120 on the side of the output layer 130 is a transparent electrode of a material like ITO. Therefore, for each light-emitting element 111, the substrate 105, the display layer 110, and the output layer 130 are deposited one above the other to form the display object 104. The display panel 103 includes a plurality of the display objects 104 disposed in the form of a matrix.

In the display panel 103 that includes the organic EL elements as the light-emitting elements, the refractive index of the light-emitting element is 1.7. If the transparent electrode layer 120 is made of ITO, the refractive index becomes approximately 2.0.

The whole of the output layer disposed on the light-emitting side of the transparent electrode layer 120 is transparent. A sheet 131 is provided with a reflecting plate 132 that reflects light 108 emitted from the light-emitting element 111. The sheet 131 having the reflecting plate is stuck to the display layer 110 by a transparent adhesive layer 133.

The sheet 131 and the adhesive layer 133 in the present embodiment are formed by an aryl resin that includes a large number of multiple bonds like a double bond and a triple bond, and the refractive index is made to be approximately 1.7. Therefore, in the display panel 103 in this embodiment, the refractive index of the output layer is about the same as that of the light-emitting element 111. Due to this, at a first interface 130b between the display layer 110 and the output layer 130, out of the light emitted from the light-emitting element 111, there is no component in the output light 108 that is output in a direction D1 (direction of emission or forward direction) of a user 109 and that undergoes total reflection. Thus, the whole of the output light 108 from the light-emitting element 111 is transmitted to the output layer 130.

Actually, the refractive index of the transparent electrode layer 120 is about 2.0 and when the refractive index of the output layer 130 is less than that of the transparent electrode layer 120, there is a total reflection of the output light 108 at the first interface 130b. However, the whole of the light 108 transmitted from the light-emitting element 111 to the transparent electrode layer 120 is input to the first interface 130b at an angle not greater than the critical angle. Therefore, even if the refractive index of the output layer 130 is less than the refractive index of the transparent electrode layer 120, the output light 108 is not reflected totally at the first interface 130b. Due to this, if the refractive index of the transparent electrode layer 120 is either same or greater than that of the light-emitting element 111, by comparing the refractive indices of the light-emitting element 111 and the output layer 130, the judgment of whether the output light 108 from the light-emitting element 111 is transmitted to the output layer 130 or not can be made.

On the other hand, when the refractive index of the transparent electrode layer 120 is less than the refractive index of the light-emitting layer 111, a part of the output light 108 is reflected totally at the interface of the transparent electrode layer 120 and the light-emitting element 111. Therefore, there is a decline in the efficiency of the output light 108.

In the display panel 103 of this embodiment, out of the output light 108 input to the output layer 130, the light input to an interface 130a at an angle smaller than the critical angle at the interface 130a being an interface with the external medium, passes through the interface 130a and is output to the external medium. Whereas, out of the output light 108 input to the output layer 130, the light having an angle of incidence greater than the critical angle is reflected by the reflecting plate 132 on the sheet 131 so that the, angle of incidence at the interface 130a becomes smaller. Therefore, the light that is input to the output layer 130 is output directly or after being reflected at the reflecting plate 132 passes through the interface 130a and is output to the external medium 150.

Figure 11:
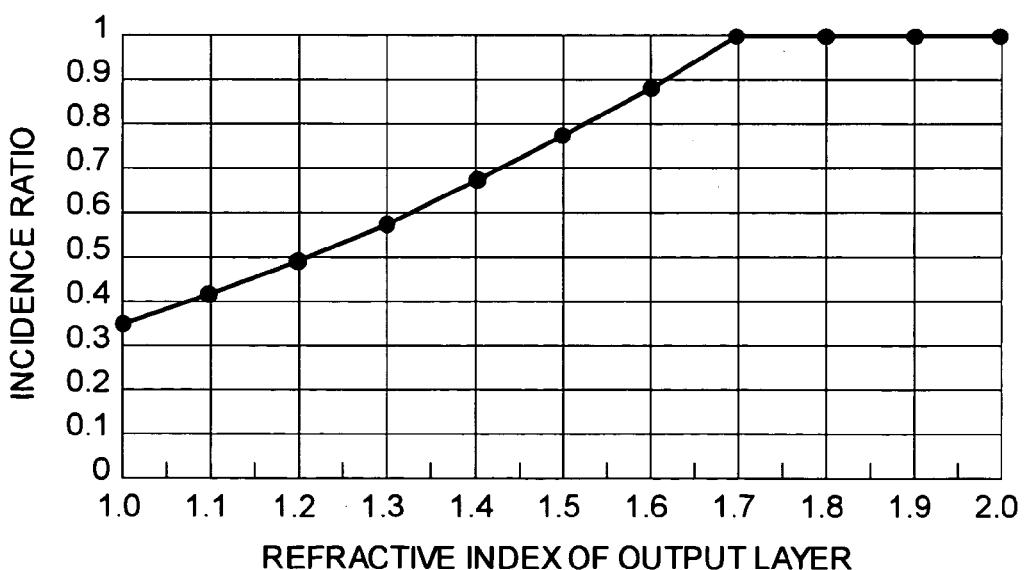
FIG. 11 is a graph indicating a relationship between refractive index and incidence rate of an output layer of the display panel according to the present invention.

FIG. 11 is a graph indicating a relationship between the proportion of incidence (incidence rate) of the output light 108 on the output layer 130 and the refractive index of the output layer 130 when the refractive index of the light-emitting element 111 is 1.7. If the refractive index of the output layer 130 becomes greater than that of the light-emitting layer 111, incidence ratio becomes one. This indicates that there is no loss due to total reflection. When a glass substrate that contains silica as a main component is used, since the refractive index is approximately 1.5, the incidence ratio becomes 0.78. Therefore, by increasing the refractive index of the output layer 130 than that of the light-emitting element 111, the proportion of the output light input to the output layer increases by approximately 30 percent. Due to this, if the output light 108 input to the output layer 130 is output to the external medium from the external layer 130, the efficiency of light can be improved by about 30 percent according to the present invention.

Resins that contain multiple bond like double bond, triple bond etc. are desirable as resins having a high refractive index of not less than 1.7 and it is easy to achieve high refractive index with aryl resins.

Figure 12:
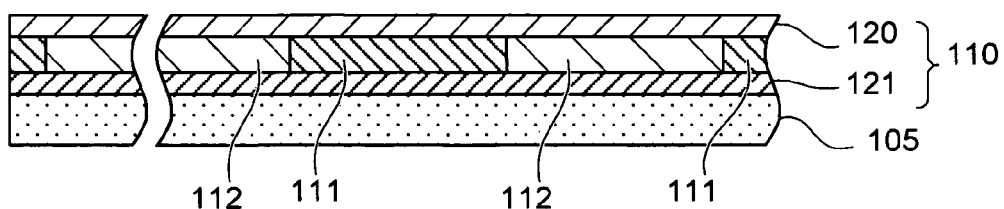
FIG. 12 is a cross sectional view of a substrate on which a display layer is formed in the method of manufacturing the display panel according to the present invention.
Figure 13:
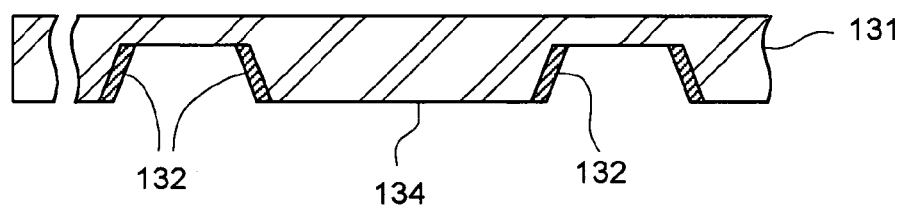
FIG. 13 is a cross sectional view of a sheet on which a micro mirror is formed in the method of manufacturing the display panel according to the present invention.
Figure 14:
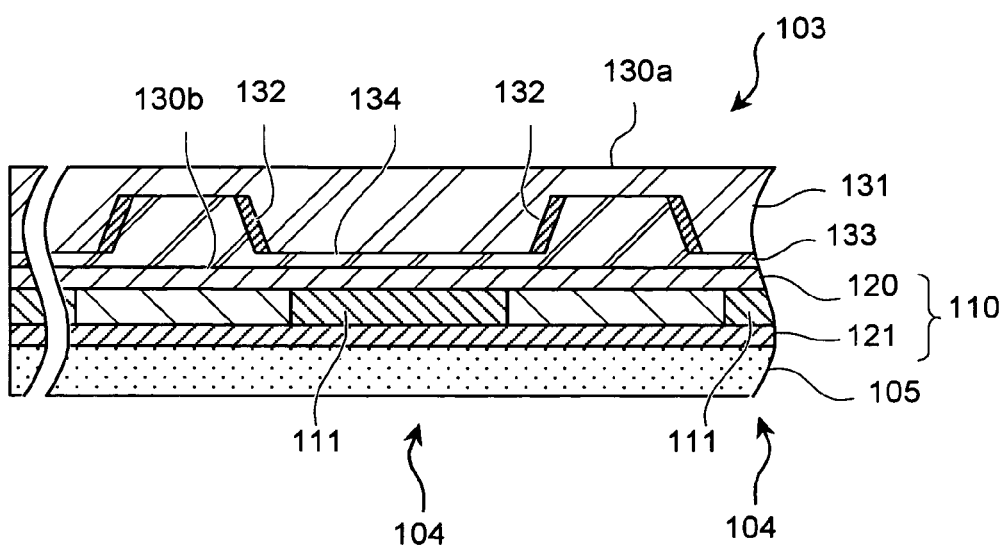
FIG. 14 is a cross sectional view of the substrate on which the sheet is stuck in the method of manufacturing the display panel according to the present invention.

FIG. 12 to FIG. 14 are cross sectional views that depict the manufacturing process of the display panel 103 in FIG. 10. As is shown in these diagrams, the substrate 105 on which the display layer 110 having the organic EL element 111 deposited in the form of a matrix is prepared (FIG. 12). Apart from this, a protrusion 134 that is trapezoidal in shape is formed on the lower surface in the form of a matrix. The sheet 131 is prepared by providing the reflecting plates 132 on inclined surfaces of the protrusion 134 (FIG. 13). Then, as is shown in FIG. 14, the sheet 131 is stuck by the adhesive layer 133 so that a side of the display layer 110 of the substrate is covered by the sheet 131. Thus, the display panel 103 can be prepared manufactured. The compositions of or the materials of the sheet 131 and the adhesive layer 133 may be the same or may be different. The composition or the material is to be selected so that the refractive index of each layer is greater than the refractive index of the light-emitting element 111. One of the embodiments is an aryl resin. Besides this, high refractive index can be achieved by a resin that contains a large number of multiple bonds like double bond and triple bond.

As mentioned above, the output light 108 input to the output layer 130 is output from the output layer to the external medium 150. To improve the output efficiency of the light 108, the reflecting plate 132 is used for changing the direction of the light. The present invention is explained with this embodiment of the display panel. However, refraction may be used for changing the direction.

Figure 15:
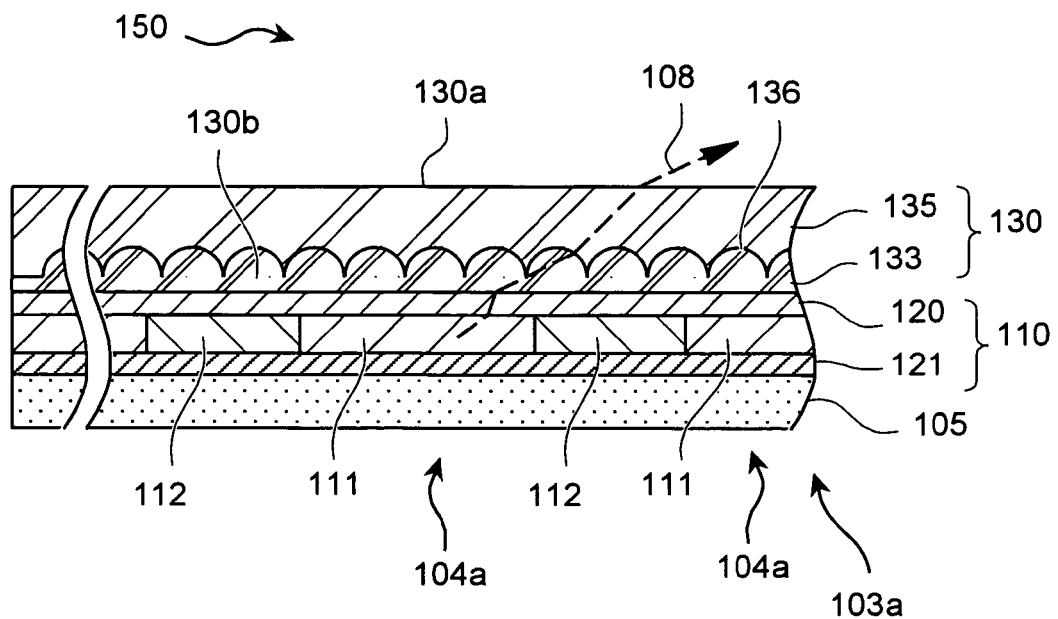
FIG. 15 is a cross sectional view of still another display panel.

FIG. 15 is a cross sectional view of a different display panel 103a. The display panel 103a includes a display object 104a disposed in a matrix form. The display object 104a includes the output layer 130 that has micro lens 136 on the inner side. The micro lens 136 changes the direction of the output light 108 by the refractive surface.

The output layer 130 includes a lens sheet 135 and an adhesive layer 133. The lens sheet 135 is processed so that the lower surface of the micro lens 136 forms a refractive surface. If the refractive index of the lens sheet 135 is the same as that of the adhesive layer 133, the micro lens 136 is not formed. Therefore, it is desirable that the refractive index of the adhesive layer 133 is greater than that of the lens sheet 135. Further, if the refractive index of the adhesive layer 133 is greater than that of the light-emitting element 111, similar as in the display panel 103, the output light 108 of the light-emitting element 111 is input to the output layer 130 without any leakage. The direction of the output light 108 is changed at the micro lens 136 and it can be output from the output layer 130 to the external medium 150. This enables to provide a display panel with even higher efficiency of light.

Figure 16:
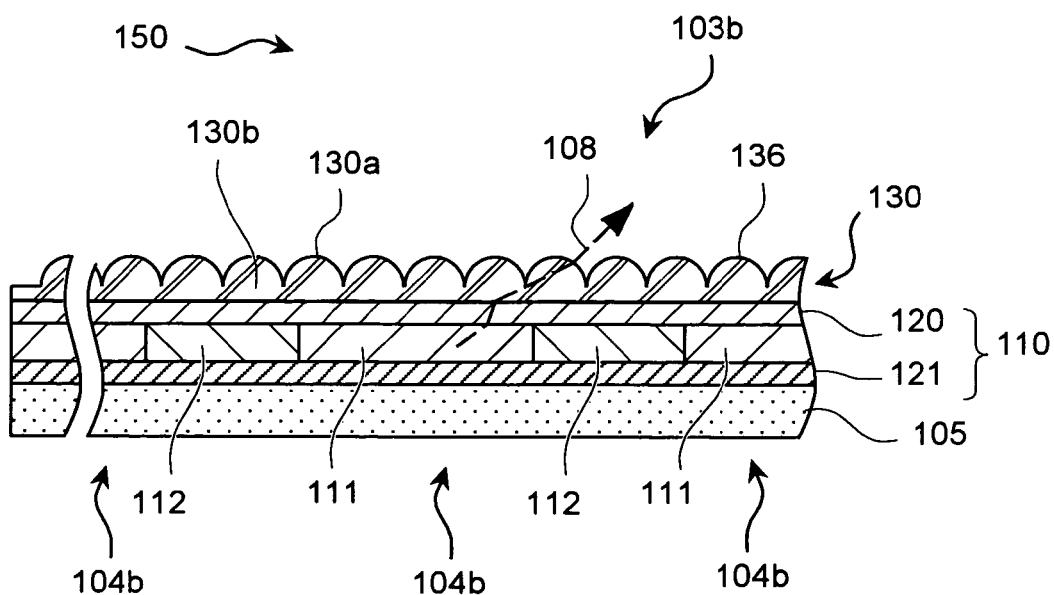
FIG. 16 is a cross sectional view of still another display panel.

FIG. 16 is a cross sectional view of another display panel 103b. In the display panel 103b, the micro lens 136 is the output layer 130. In the display panel 103b, a display object 104b is disposed in the form of a matrix. In the display object 104, a refractive surface being a micro lens 136 is an interface 130a with the external medium 150. In the display panel 103b, a surface of the micro lens 136 is the interface 130a. The angle of incidence of the output light 108 becomes smaller than the critical angle by changing the inclination of the interface 130a. As a result, it is possible to output the output light to the external medium 150 with improved efficiency. Thus, the efficiency of light is further improved.

These micro lenses 136 can be formed directly on the transparent electrode layer 120 by ink-jet method. This enables to provide a thin and very bright display panel at low cost.

Figure 17:
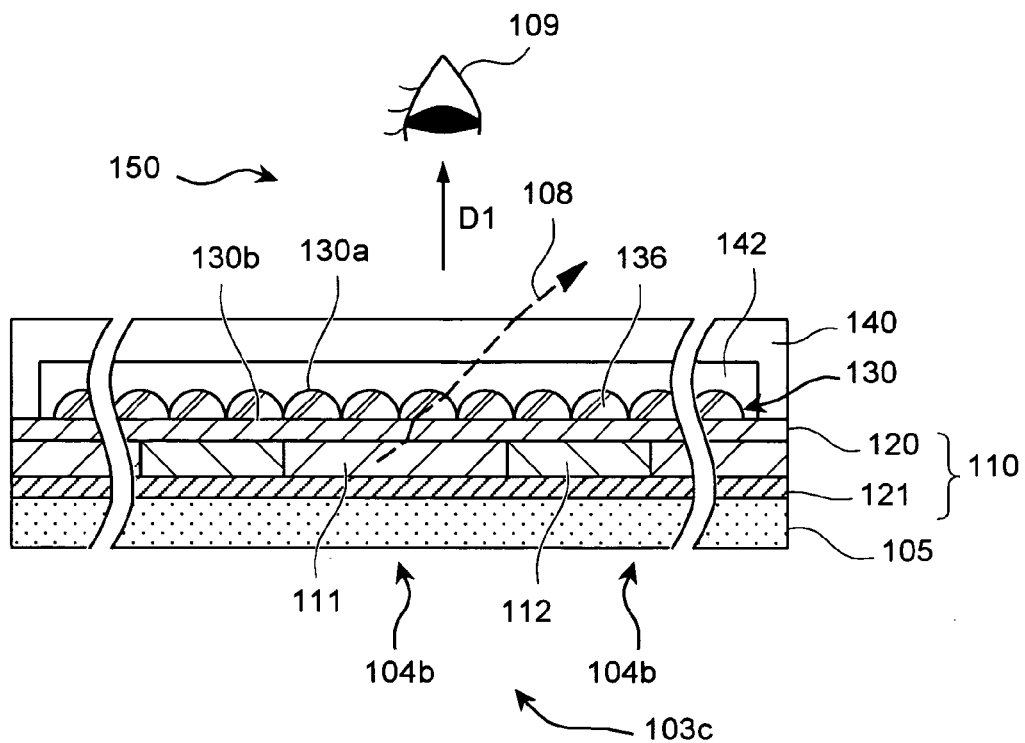
FIG. 17 is a cross sectional view of still another display panel.

FIG. 17 is a cross sectional view of still another display panel 103c. The display panel 103 includes a transparent sealing layer 140 on the emitting side of the micro lens 136. An inert gas 142 having a refractive index not less than one is filled inside the sealing layer 140. The sealing layer 140 and the inter gas 142 prevent the deterioration of the organic EL element 111 due to oxidation or absorption of moisture. The display panel 103c transmits the output light 108 to the user 109 through the external medium (air) having a refractive index of one and displays an image. For this reason, if the refractive index of the inert gas 142 inside the sealing layer 140 is less than one, the critical angle at the interface 130a between the output layer 130 and the inert gas 142 becomes smaller than the critical angle at the interface with air, thereby increasing the loss due to the total reflection. Whereas, if the refractive index of the inert gas becomes greater than one, the refractive power of the micro lens 136 decreases. Due to this, the efficiency of changing the direction of the output light 108 to D1 is declined. Moreover, if the refractive index of the sealing layer 140 is not less than that of the inert gas 142, there is a loss due to the total reflection when the light is incident on the sealing layer 140. This imposes limitations on selection of material of the sealing layer 140. Therefore, it is desirable that the refractive power of the inert gas is approximately one.

Figure 18:
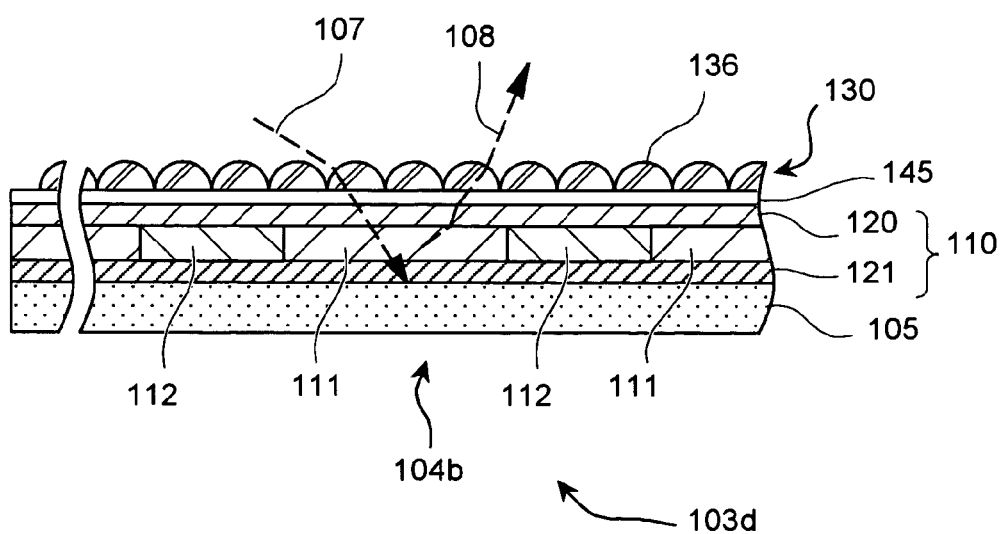
FIG. 18 is a cross sectional view of still another display panel.

FIG. 18 is a cross sectional view of still another display panel 103d. In this display panel 103d a display object 104d is disposed in a matrix form. In the display object 104d, an anti-reflective layer 145 is deposited on the transparent electrode layer 120 and the output layer 130 is formed by the micro lens 136. When there is a big difference in the refractive index of the output layer 130 and that of the transparent electrode layer 120, even if the light is incident at the interface of the output layer 130 and the transparent electrode layer 120 at less than the critical angle, there is a reflection due to the difference in the refractive index and the efficiency of light is declined. Moreover, external light 107 like sun light or illuminated light that is input to the display panel 103 from the external medium 150 is reflected due to the difference between the refractive index of the output layer 130 and that of the transparent electrode layer 120. This declines the contrast of the output light 108 emitted from the light-emitting element 111. To avoid this, the anti-reflective layer 145 is disposed between the display layer 110 and the output layer 130, i.e. between the transparent electrode layer 120 and the output layer 130. This improves the efficiency of light and prevents the reflection of the external light 107. In the display panel 103, to prevent reflection due to the difference in the refractive index of all layers, it is desirable to dispose an anti-reflective at the interface of the light-emitting element 111 and the transparent electrode layer 120. However, it is not possible to dispose an insulating anti-reflective layer between the light-emitting element 111 and the transparent electrode layer 120. Therefore, the anti-reflective 145 is disposed between the display layer 110 and the output layer 130 and the reflection due to the difference in the refractive indices is reduced as much as possible. This enables to provide the display panel 103d that can display a clear image with high contrast and high light extraction efficiency.

In the display panels 103 to 103d mentioned above, a material having a high refractive index is used for the output layer 130 to supply the light 108 that is output from the light-emitting element 111 to the output layer 130 without leakage. The optical path is changed at the output layer 130 and the light is incident on the interface 130a with the external medium at an angle smaller than the critical angle that becomes smaller due to use of the material having a high refractive index. Thus, the efficiency of light is further improved. The direction of the output light 108 can be changed by reflection or refraction. In a case of changing the direction of the output light by refraction, it is possible to use prism instead of restricting to lens.

According to the result of simulation in FIG. 11, with the present invention, compared to the case of not using the material having a high refractive index, it is possible to improve the efficiency of light further by about 30 percent. The present invention enables to provide a display panel that can display a clear image with high brightness at low power consumption.

Figure 19:
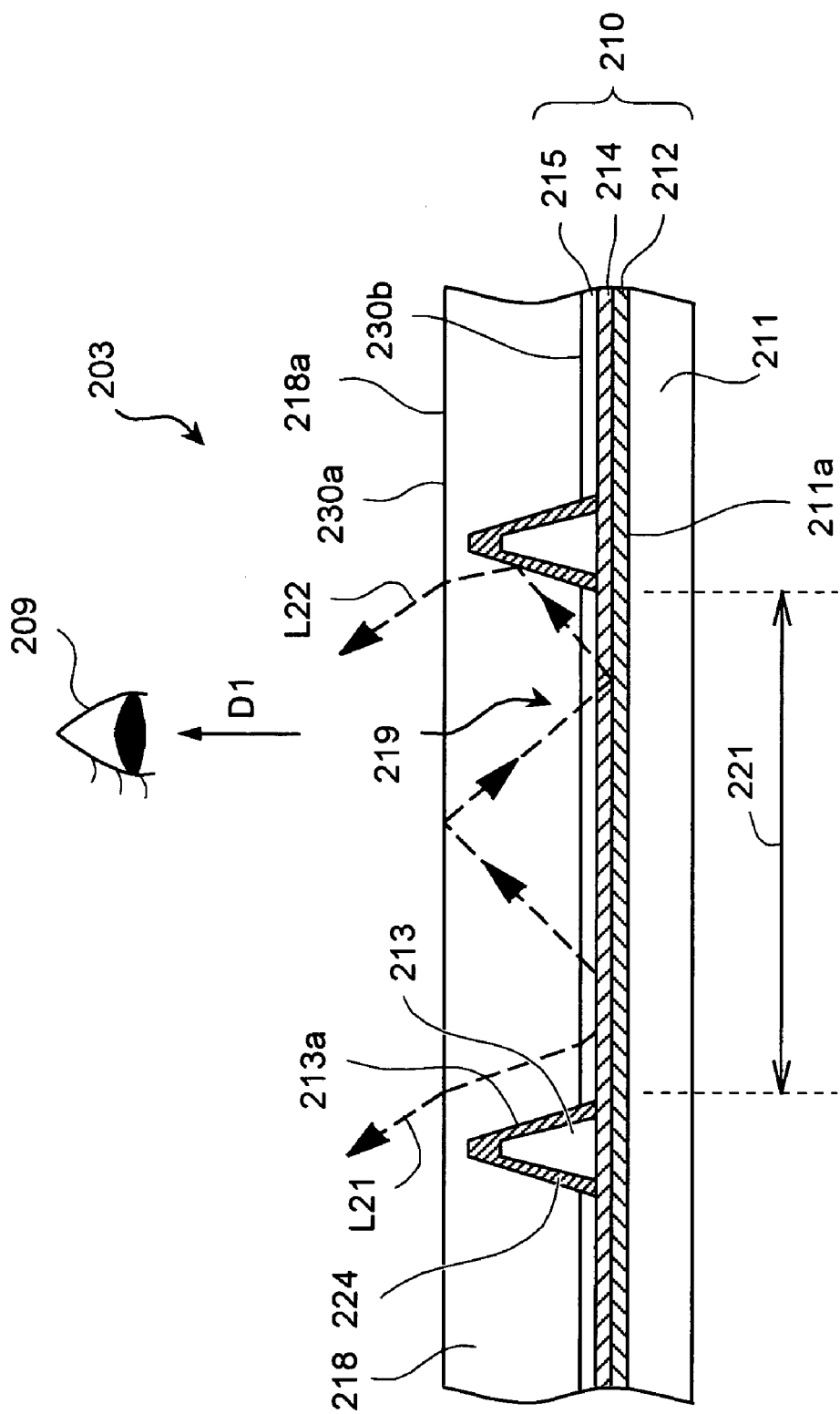
FIG. 19 is a cross sectional view of still another display panel.

FIG. 19 is a cross sectional view of still another display panel 203. The display panel 203 according to the present embodiment includes a large number of pixels that are the organic EL elements and are disposed in a matrix form, and can be driven by an active matrix or by a passive matrix. The display panel 203 includes a plurality of display objects 219 that are disposed in an array form or a matrix from in two dimensional direction. The display object 219 or a light element forms one pixel. The display object 219 includes a separate light-emitting layer 214 and a reflective surface 213a provided at a periphery of the light-emitting layer 214.

Therefore, by driving each display object 219, a two dimensional image can be displayed. Each display object 219 is disposed between the electrodes and includes a light-emitting layer 214 and a protective layer 218. The light-emitting layer 214 emits light when a voltage is applied between the electrodes. The protective layer 218 is deposited on the emitting side of the light-emitting layer 214 and forms an interface 218a with the external medium. A reflective surface 213 is an angle changer provided at a periphery of the light-emitting layer 214. The reflective surface 213 changes the direction of light L22 that is propagated inside the protective layer 218 so that the angle is smaller than the critical angle of the interface 218a. This improves the efficiency of light and the light extraction efficiency of light.

The display panel 203 includes a substrate 211 like a glass substrate that is a supporting plate of a panel. A cathode layer 212 (also called as an electrode layer 212 or a reflective layer 212) is deposited on an upper surface of the substrate 211. The cathode layer 212 includes a signal line, a driving element, and a film of multiple layers of a dielectric substance or a metal like aluminum. Thus, in the display panel 203 in this embodiment, the cathode layer 212 is a reflective layer and has a function of reflecting a part of light emitted from the light-emitting layer 214 toward the protective layer 218 and to reflect light that undergoes total reflection at the interface 218a toward the protective layer 218.

Further, a bank 213 of a predetermined height made of polyimide is deposited in a predetermined pattern on the upper surface 211a of the substrate 211. An area 221 surrounded with banks 213 from four sides is formed. The area 221 is an area of forming of the organic EL light-emitting layer 214 and is a light-emitting area.

The light-emitting layer 214 is deposited on the area 221 using the ink-jet technology. The bank 213 is a layer that can be used for alignment during depositing the light-emitting layer 214 and separates the light-emitting layer 214. The light-emitting layer 214 may be a separate layer that includes an organic EL element or it can be a layer to which a hole transport layer or an electron transport layer is added. A transparent electrode (an anode layer) 215 made of ITO is deposited on the light-emitting layer 214. When a voltage is applied to the cathode layer 212 and the anode layer 215, the light-emitting layer 214 disposed between these electrodes emits light. The protective layer 218 is deposited on the anode layer 215 (light-emitting side) and the emitting side of the light-emitting layer 214 covered by the protective layer 218. The protective layer 218 forms the interface 218a with the external medium. In this case, the electrode layer 212 is a cathode and the electrode layer 215 is an anode. However, if the electrode layer 212 is a reflecting electrode and if the electrode layer 215 is an optically transparent layer, there is no need to restrict to the above mentioned combination.

The protective layer 218 is a thin and transparent layer. The protective layer 218 has a thickness that allows the light emitted from the light-emitting layer 214 at an angle greater than the critical angle with respect to the interface 218a to undergo total reflection at the interface 18a inside the area of the light-emitting layer 214. In a conventional display panel that changes an angle at the inclined surface, a protective layer, which has a thickness that does not allow the light emitted from the light-emitting layer at an angle of total reflection, to reach an interface between the protective layer and the external medium. Whereas, in the display panel 203 in this embodiment, a film of the protective layer 218 that is deposited, has a thickness that allows the light emitted at not less than the critical angle to reach the interface 218a and to be reflected from the interface 218a. Therefore, out of the light L that is emitted from the light-emitting layer 214, light L21 emitted at an angle smaller than the critical angle of the interface 218a is output from the interface 218a to the external medium and light L22 emitted at an angle not smaller than the critical angle of the interface 218a undergoes total reflection and returns toward the light-emitting layer 214 and is reflected once again at the electrode layer 212. The light L22 emitted at not smaller than the critical angle, is propagated inside the protective layer 218.

The light L22 propagated in the protective layer 218 reaches the inclined surface of the bank 213 at a periphery of the light-emitting area 221. The angle of the light L22 is changed and becomes less than the critical angle. Due to this, the light L22 passes through the interface 218a and is output to the external medium. In other words, a side surface 213a of the bank 213 is inclined so that it becomes wide in the direction of the light-emitting side. A reflecting film 224 of aluminum etc. is deposited on the side surface 213a. Due to this, direction (angle) of the light L22 that is subjected to repetitive reflection between the interface 218a and the anode layer 212 that is a reflective layer is changed at the reflective surface 214a. Therefore, the light L22 reflected from the reflective surface 213a is incident on the interface 218a at an angle smaller than the critical angle and is output. For this reason, in the display panel 203 in this embodiment, the light L22 that undergoes total reflection at the interface 218a due to the use of the thin protective layer, exists. However, since the light L22 reaches the reflective surface 213a due to multiple reflection and is output to the external medium after having changed the direction, there is hardly any light that is confined due to the total reflection. This enables to provide a display panel that has efficiency of light and light extraction efficiency equivalent to or better than those of the conventional display panel equipped with a thick protective layer and a high reflective surface.

In the display panel 203 in this embodiment the refractive index of the light-emitting layer 214 that is formed by the organic EL is 1.7. If the anode layer 215 that is a transparent electrode layer is made of ITO, the refractive index become approximately 2.0.

The protective layer 218 in the present embodiment is formed by an aryl resin that includes a large number of multiple bonds like a double bond and a triple bond, and the refractive index is made to be approximately 1.7. Therefore, in the display panel 203 in this embodiment, the refractive index of the protective layer 218 that is an output layer, is about the same as that of the light-emitting layer 214. Here, the cathode layer 212, the light-emitting layer 214, and the anode layer 215 form a display layer 210. At a first interface 230b between the display layer 210 and the protective layer 218 that is an output layer, out of the light that is output from the light-emitting layer 214, there is no component in the output light that is output in a direction D1 of a user 209 that undergoes total reflection. Consequently, the whole of the output light from the light-emitting layer 214 is transmitted to the protective layer 218.

Actually, the refractive index of the anode layer 215 that is a transparent electrode layer is about 2.0 and when the refractive index of the protective layer 218 that is an output layer is less than that of the anode layer, there is a total reflection of the light at the first interface 230b. However, the whole of the light that is transmitted from the light-emitting layer 214 to the anode layer 215 is input to the first interface 230b at an angle not greater than the critical angle. Therefore, even if the refractive index of the protective layer 218 is less than the refractive index of the anode layer 215, the output light is not reflected totally at the first interface 230b. Consequently, if the refractive index of the anode layer 215 is either same or greater than that of the light-emitting layer 214, by comparing the refractive indices of the light-emitting layer 214 and the output layer 230, the judgment of whether the output light from the light-emitting layer 214 is transmitted to the output layer 230 or not can be made.

On the other hand, when the refractive index of the anode layer 215 is less than the refractive index of the light-emitting layer 214, a part of the output light is reflected totally at the interface of the anode layer 215 and the light-emitting layer 214. Therefore, there is a decline in the efficiency of the output light.

In the display panel 203 in this embodiment, out of the output light input to the output layer 230, the light input to a second interface 230a at an angle smaller than the critical angle at the interface 230a is output to the external medium. Whereas, out of the output light input to the output layer 230, the light having an angle of incidence greater than the critical angle is reflected by the reflective surface 213a so that the angle of incidence at the interface 230a becomes smaller. Therefore, the light input to the output layer 230 is output directly or after being reflected at the reflective surface 213a passes through the interface 230a and is output to the external medium. This improves the light extraction efficiency.

Figure 20:
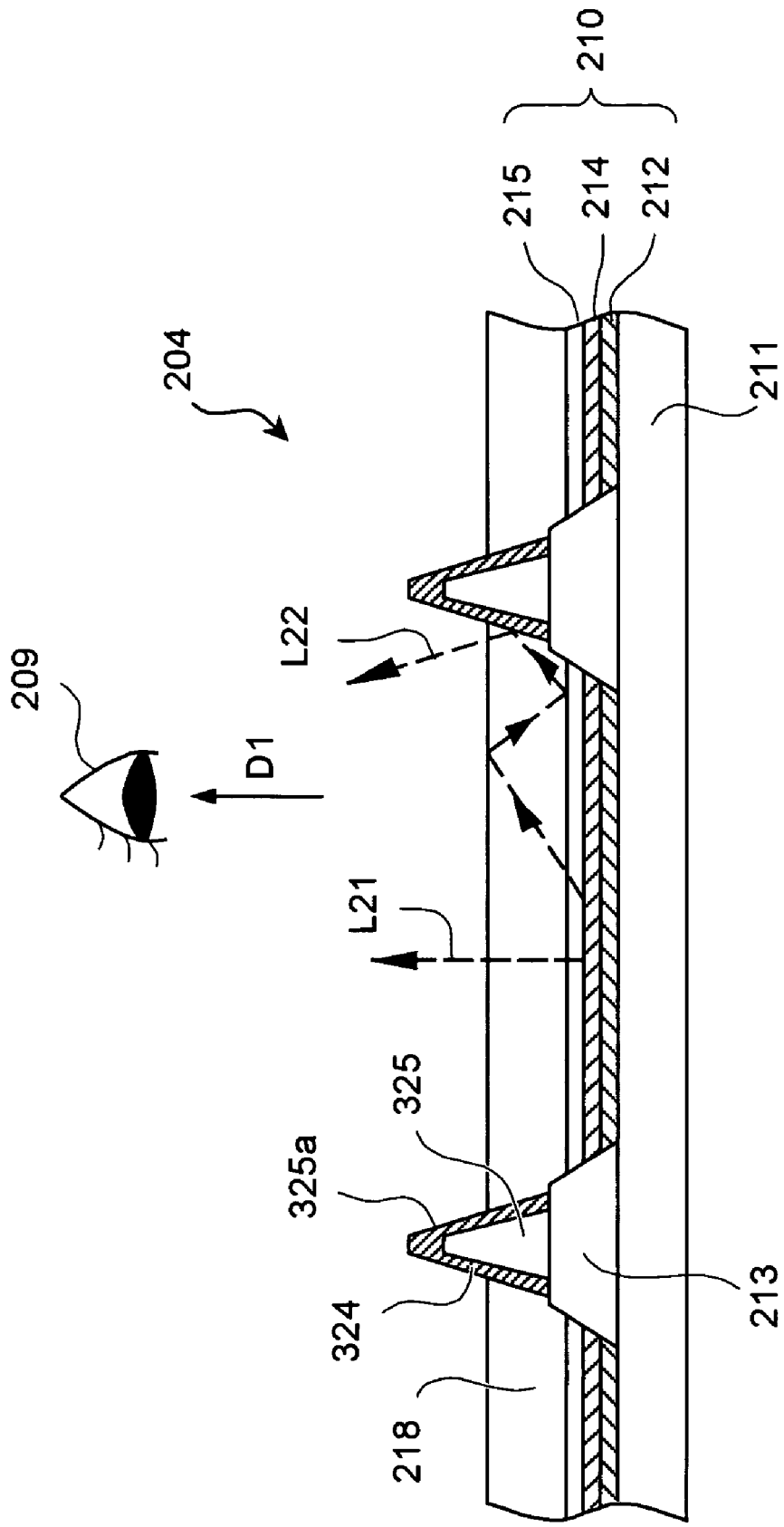
FIG. 20 is a cross sectional view of still another display panel.

FIG. 20 is a cross sectional view of still another display panel 204. The display panel 203 mentioned above includes the reflective surface 213a on the bank 213 surrounding (enclosing) the light-emitting layer 214 and this reflective surface 213a is disposed on the side of the light-emitting layer 214. In other words, there is no gap in a vertical direction or in the direction of emitting between the reflective surface 213a and the light-emitting layer 214. Thus, the leakage of light (cross talk) emitted from the light-emitting layer 214 is prevented and the efficiency of light is the maximum in this structure. Moreover, a small portion of the protective layer 218 is deposited on the bank 213, but there may be the protective layer 218 on the anode layer 215. It is also possible to have a structure in which the anode layer is covered (enclosed) by the protective layer 218 and the thickness of the protective layer is either same as the height of the bank 213 or less than the height of the bank 213. This enables to make a very thin display panel. However, in this display panel 203, there is a need to form the insulating layer while forming the reflective surface 213a, to avoid short circuit between the electrodes. This may complicate the manufacturing of the display panel.

To avoid this, the display panel 204 in FIG. 20 includes a protrusion 325 instead of forming the reflecting film 224 on the inclined surface 213a of the bank 213. The protrusion 325 is made of an insulating material and is formed on a side of the protective layer 218 in a position overlapping with the bank 213. The reflecting film 324 is deposited on an inclined surface 325a of the bank and an area that is surrounded by the protrusion 325 is covered by the protective layer 218. With this display panel 204, there is no concern of short-circuit of electrodes due to the reflecting film and there is no need to form an insulating film to prevent the short circuit between the electrodes. Thus, the display panel 204 can be manufactured with ease. However, there is a gap between the light-emitting layer 214 and the reflective surface 325a in the direction of emission due to which there is a possibility of leakage of light in the bank 213. The height of the protrusion 325 in the display panel 204 can be made to be the about the same as that of the bank 213, but it is desirable to reduce the height of the protrusion 325 to make the display panel thin. On the other hand, when there is need to have some thickness to perform the function of the protective layer 218 sufficiently, the thickness of the protective layer 218 can be controlled freely by adjusting the height of the protrusion 325.

Furthermore, in this embodiment also, similar to the display panel 203, the refractive index of the protective layer 218 that is an output layer, is either approximately same or greater than that of the light-emitting layer 214. Due to this, there is no component in the output light reflected in the direction D1 (direction of emission or forward direction) of the user 209. Consequently, the whole of the output light from the light-emitting layer 214 is transmitted to the protective layer 218 that is an output layer.

Figure 21:
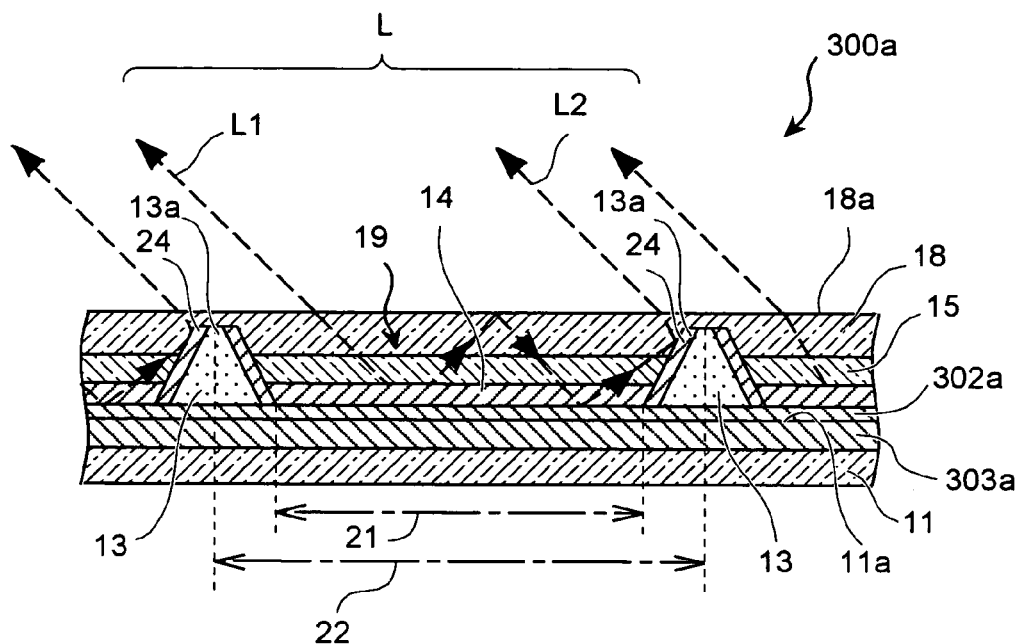
FIG. 21 is a cross sectional view of still another display panel.
Figure 22:
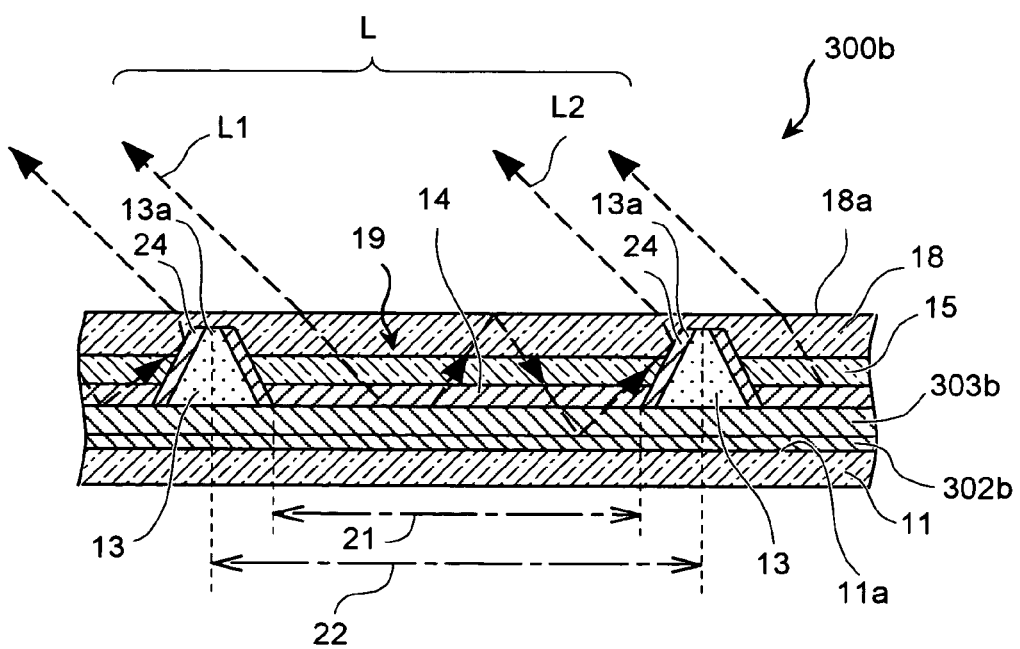
FIG. 22 is a cross sectional view of still another display panel.

In the display panel mentioned above, the reflective layer, which allows the light that has undergone total reflection at an interface to be reflected and guides the light to the angle changer, is the cathode layer being one of electrodes. However, the reflective layer and the cathode layer may be distinguished from each other. FIG. 21 and FIG. 22 are cross sectional views of display panels in this case. As shown in FIG. 21, a reflective layer 302a may be disposed between the light-emitting layer 14 and a cathode layer 303a. This reflective layer 302a must have sufficient conductivity so that a voltage is applied to the light-emitting layer 14 by the two electrodes (the anode layer 15 and the cathode layer 303a). On the other hand, as shown in FIG. 22, a reflective layer 302b may be disposed immediately below a cathode layer 303b. This cathode layer 303b must have sufficient transparency like the anode layer 15.

The display panel according to the present invention is explained with an example of the display panel that is used in a portable telephone. However, the present invention can also be applied to a small sized display panel that is used in personal digital assistants (PDA), car navigation etc. The present invention can also be applied to a display for a personal computer, a television, a car navigation system, a big sized display panel of 30 inches that are being developed a lot in recent years. Moreover the light-emitting layer that uses an organic EL element is explained here. However, the present invention can also be applicable to a PDP, an LED, an inorganic EL element, and organic EL element, a field emission element etc. that use a display panel in which a light-emitting layer that emits light when the voltage is applied between the electrodes.

Thus, in the present invention, by utilizing the total reflection at the interface actively, the angle of the light that is fully reflected is changed by the angle changer like the reflective surface that is provided at a periphery of the light-emitting layer. Thus, by employing the thin protective layer the light extraction efficiency can be improved similarly as in the conventional display panel that includes a reflecting inclined surface. This enables to manufacture the bright and very thin self-emitting element and the display panel. Moreover, the present invention enables to change the angle of propagation of light at a low (height) reflective surface thereby improving not only the light extraction efficiency but also the brightness of each pixel by reducing the size of a pixel. Thus, the self-emitting element and the display panel, in spite of being thin can display very bright images and characters than before.

Furthermore, in the present invention, by making the refractive index of the output layer same or greater than that of the light-emitting element, the whole of the output light from the light-emitting element can be input to the output layer. By providing the angle changer in the output layer that changes the optical path, the refractive index is made greater. This enables to output the output light efficiently to the external medium to incident it at an angle smaller than the critical angle with respect to the interface of the external medium and the output layer having its critical angle decreased. Consequently, this enables to improve the efficiency of the light to a great extent that is output from the light-emitting element and to provide the control panel that can display a clear and bright image.

Furthermore, in the present invention, in addition to the employing of the thin protective layer, the refractive index of the output layer is made same as that of the light-emitting element or greater. This enables to improve further the light extracting efficiency.

What is claimed is:

1. A self-emitting element comprising:
    a substrate;
    a light-emitting layer that is disposed between electrodes and that emits light upon applying a voltage between the electrodes, one of the electrodes being deposited on a surface of the substrate;
    a protective layer that covers an emitting side of the light-emitting layer, forms an interface between the protective layer and an external medium, and has a thickness that allows the light emitted from the light-emitting layer to undergo total reflection at least once at the interface in an area of the light-emitting layer, the protective layer being deposited on another one of the electrodes on an opposite side, as viewed from the light-emitting layer, to the substrate;
    a reflective layer that is disposed on an opposite side, as viewed from the light-emitting layer, to the protective layer; and
    an angle changer that is disposed at a periphery of the light-emitting layer, and changes a direction of the light emitted from the light-emitting layer and propagating in the protective layer so that the light is incident on the interface at less than a critical angle.

2. The self-emitting element according to claim 1, wherein the reflective layer is one of the electrodes.

3. The self-emitting element according to claim 1, wherein the angle changer is a reflective surface that is inclined so that a space at the emitting side increases.

4. The self-emitting element according to claim 1, wherein the angle changer is a refractive surface that is inclined so that a space at the emitting side decreases.

5. The self-emitting element according to claim 1, further comprising a bank that projects on the emitting side to separate the light-emitting layer from other light-emitting layer, wherein an inner surface of the bank is the angle changer, and the protective layer is formed in an area that is enclosed with the bank.

6. The self-emitting element according to claim 1, further comprising:
    a bank that projects on the emitting side to separate the light-emitting layer from other light-emitting layer; and
    a protrusion, made of an insulating material, that projects toward the emitting side from the bank, wherein
    an inner surface of the protrusion is the angle changer, and the protective layer is formed in an area that is enclosed with the protrusion.

7. The self-emitting element according to claim 1, wherein the light-emitting layer is an organic electro-luminescent layer.

8. A display panel comprising:
    a substrate;
    a plurality of light-emitting layers, each of the light-emitting layers being disposed between electrodes, and emitting light upon applying a voltage between the electrodes, one of the electrodes being deposited on a surface of the substrate;
    a protective layer that covers an emitting side of the light-emitting layers, forms an interface between the protective layer and an external medium, and has a thickness that allows the light emitted from the light-emitting layers to undergo total reflection at least once at the interface in an area of the corresponding light-emitting layer, the protective layer being deposited on another one of the electrodes on an opposite side, as viewed from the light-emitting layer, to the substrate;
    a reflective layer that is disposed on an opposite side, as viewed from the light-emitting layers, to the protective layer; and
    a plurality of angle changers, each of the angle changer being disposed at a periphery of each of the light-emitting layers, that change direction of the light emitted from the light-emitting layer and propagating in the protective layer so that the light is incident on the interface at less than a critical angle.

9. The display panel according to claim 8, further comprising a plurality of banks, each of the banks projecting on the emitting side to separate the light-emitting layers from each other, each of inner surfaces of the banks being each of the angle changers, and the protective layer being formed in an area that is enclosed with the each of the banks.

10. The display panel according to claim 8, further comprising:
    a plurality of banks, each of the banks projecting on the emitting side to separate the light-emitting layers from each other, and
    a plurality of protrusions, each of the protrusions, made of an insulating material, projecting toward the emitting side from the each of the banks, wherein
    each of inner surfaces of the protrusions is each of the angle changers, and the protective layer is formed in an area that is enclosed with the each of the protrusions.

11. A display apparatus comprising:
    a display panel that includes
        a substrate;
        a plurality of light-emitting layers, each of the light-emitting layers being disposed between electrodes and emitting light upon applying a voltage between the electrodes, one of the electrodes being deposited on a surface of the substrate;
        a protective layer that covers an emitting side of the light-emitting layers, forms an interface between the protective layer and an external medium, and has a thickness that allows the light emitted from the light-emitting layers to undergo total reflection at least once at the interface in an area of the corresponding light-emitting layer, the protective layer being deposited on another one of the electrodes on an opposire side, as viewed from the light-emitting layer, to the substrate;

a reflective layer that is disposed on an opposite side, as viewed from each of the light-emitting layers, to the protective layer; and a plurality of angle changer, each of the angle changer being disposed at a periphery of each of the light-emitting layers, that change direction of the light emitted from the light-emitting layer and propagating in the protective layer so that the light is incident on the interface at less than a critical angle; and a drive unit that drives the light-emitting layers of the display panel and displays an image.

12. A method of manufacturing a self-emitting element according to claim 1, the method comprising:

forming a bank, as the angle changer, that projects on the emitting side to separate the light-emitting layer from other light-emitting layer; and forming the protective layer in an area that is enclosed with the bank.

13. A method of manufacturing a self emitting element according to claim 1, the method comprising:

forming a protrusion as the angle changer with an insulating material to separate the light-emitting layer from other light-emitting layer so that the protrusion is protruded from a bank that projects on the light-emitting side; and forming the protective layer in an area that is enclosed with the protrusion.

14. A self-emitting element comprising:

a display layer that includes a light-emitting element, the light-emitting element including a substrate, and a light-emitting layer that is disposed between electrodes for applying a voltage therebetween, one of the electrodes being deposited on a surface of the substrate, another one of the electrodes being disposed on an opposite side of the substrate, as viewed from the light-emitting layer; and an output layer that is transparent, is disposed on the another one of the electrodes in an emitting direction of the display layer, and includes an angle changer that changes a direction of light output from the light-emitting element to a direction of the emitting side, wherein a refractive index of the output layer is either almost the same as or greater than a refractive index of the light-emitting element.

15. The self-emitting element according to claim 14, wherein the angle changer is any one of a micro lens, a micro prism, and a micro mirror.

16. The self-emitting element according to claim 14, wherein the display layer includes a transparent electrode layer, and the transparent electrode layer has a refractive index greater than that of the light-emitting element and sandwiches the light-emitting element.

17. The self-emitting element according to claim 16, further comprising an antireflective layer in an interface between the transparent electrode layer and the output layer.

18. The self-emitting element according to claim 14, further comprising a sealing layer that is transparent, and is disposed in an emitting direction of the output layer, wherein an inert gas that has a refractive index of almost one and is filled between the output layer and the sealing layer.

19. A display panel comprising a plurality of self-emitting elements that are arranged two-dimensionally in a matrix form, wherein each of the self-emitting elements includes a display layer that includes a light-emitting element, the light-emitting element including a substrate, and a light-emitting layer that is disposed between electrodes for applying a voltage therebetween, one of the electrodes being deposited on a surface of the substrate, another one of the electrodes being disposed on an opposite side of the substrate, as viewed from the light-emitting layer; and an output layer that is transparent, is disposed on another one of the electrodes in an emitting direction of the display layer, and includes an angle changer that changes a direction of light output from the light-emitting element to a direction of the emitting side, wherein a refractive index of the output layer is either almost the same as or greater than a refractive index of the light-emitting element.

20. A display apparatus comprising:

a display panel that includes a plurality of self-emitting elements that are arranged two-dimensionally in a matrix form, wherein each of the self-emitting elements includes a display layer that includes a light-emitting element, the light-emitting element including a substrate, and a light-emitting layer that is disposed between electrodes for applying a voltage therebetween, one of the electrodes being deposited on a surface of the substrate, another one of the electrodes being disposed on an opposite side of the substrate, as viewed from the light-emitting layer; and an output layer that is transparent, is disposed on the another one of the electrodes in an emitting direction of the display layer, and includes an angle changer that changes a direction of light output from the light-emitting element to a direction of the emitting side, wherein a refractive index of the output layer is either almost the same as or greater than a refractive index of the light-emitting element; and a drive unit that drives the display layer of the display panel and displays an image.

21. A self-emitting element comprising:

a substrate;

a light-emitting layer that is disposed between electrodes and that emits light upon applying a voltage between the electrodes, one of the electrodes being deposited on a surface of the substrate;

a protective layer that covers an emitting side of the light-emitting layer, forms an interface between the protective layer and an external medium, and has a thickness that allows the light emitted from the light-emitting layer to undergo total reflection at least once at the interface in an area of the corresponding light-emitting layer, the protective layer being deposited on another one of the electrodes on an opposite side, as viewed from the light-emitting layer, to the substrate;

a reflective layer that is disposed on an opposite side, as viewed from the light-emitting layer, to the protective layer; and an angle changer that is disposed at a periphery of the light-emitting layer, and changes a direction of the light emitted from the light-emitting layer and propagating in the protective layer so that the light is incident on the interface at less than a critical angle, wherein a refractive index of the protective layer is either almost the same as or greater than a refractive index of the light-emitting layer.

22. A self-emitting element comprising:

a display layer that includes a light-emitting element, the light-emitting element including a substrate, and a light-emitting layer that is disposed between electrodes for applying a voltage therebetween, one of the electrodes being deposited on a surface of the substrate, another one of the electrodes being disposed on an opposite side of the substrate, as viewed from the light-emitting layer; and an output layer that is transparent, is disposed on the another one of the electrodes in an emitting direction of the display layer, and includes an angle changer that changes a direction of light output from the light-emitting element to a direction of the emitting side, wherein the angle changer is a micro lens; and a refractive index of the output layer is either almost the same as or greater than a refractive index of the light-emitting element.

23. A self-emitting element comprising:

a display layer that includes a light-emitting element, the light-emitting element including a substrate, and a light-emitting layer that is disposed between electrodes for applying a voltage therebetween, one of the electrodes being deposited on a surface of the substrate, another one of the electrodes being disposed on an opposite side of the substrate, as viewed from the light-emitting layer; and an output layer that is transparent, is disposed on the another one of the electrodes in an emitting direction of the display layer, and includes an angle changer that changes a direction of light output from the light-emitting element to a direction of the emitting side, wherein the angle changer is a micro prism which changes the direction of the light by refraction; and a refractive index of the output layer is either almost the same as or greater than a refractive index of the light-emitting element.

* * * * *